United States Patent
Greenlee et al.

(10) Patent No.: US 12,354,658 B2
(45) Date of Patent: Jul. 8, 2025

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Jordan D. Greenlee, Boise, ID (US); Rajasekhar Venigalla, Boise, ID (US); Tom George, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 588 days.

(21) Appl. No.: 17/727,487

(22) Filed: Apr. 22, 2022

(65) Prior Publication Data

US 2023/0343393 A1    Oct. 26, 2023

(51) Int. Cl.
| | |
|---|---|
| *G11C 16/04* | (2006.01) |
| *H01L 23/48* | (2006.01) |
| *H10B 41/10* | (2023.01) |
| *H10B 41/27* | (2023.01) |
| *H10B 43/10* | (2023.01) |
| *H10B 43/27* | (2023.01) |

(52) U.S. Cl.
CPC ........ *G11C 16/0483* (2013.01); *H01L 23/481* (2013.01); *H10B 41/10* (2023.02); *H10B 41/27* (2023.02); *H10B 43/10* (2023.02); *H10B 43/27* (2023.02)

(58) Field of Classification Search
CPC .............. G11C 16/0483; H01L 23/481; H01L 23/5283; H01L 23/53261; H10B 41/10; H10B 41/27; H10B 43/10; H10B 43/27
See application file for complete search history.

(56) References Cited

U.S. PATENT DOCUMENTS

| | | | |
|---|---|---|---|
| 11,101,210 B2 * | 8/2021 | Hu ........................ | H10B 41/10 |
| 2021/0280594 A1 * | 9/2021 | Hopkins ................ | H10B 43/10 |
| 2021/0376122 A1 * | 12/2021 | Hopkins ................ | H10B 43/10 |

* cited by examiner

*Primary Examiner* — Benjamin P Sandvik
*Assistant Examiner* — John Patrick Cornely
(74) *Attorney, Agent, or Firm* — Wells St. John P.S.

(57) ABSTRACT

A method used in forming a memory array comprising strings of memory cells comprises forming a stack comprising vertically-alternating first tiers and second tiers directly above a conductor tier that comprises silicon-containing material. The stack comprises laterally-spaced memory-block regions and a through-array-via (TAV) region. The stack comprises channel-material strings that extend through the first tiers and the second tiers in the memory-block regions. The stack comprises TAV openings in the TAV region that extend to the silicon-containing material of the conductor tier. A metal halide is reacted with the silicon of the silicon-containing material to deposit the metal of the metal halide in the conductor tier. After depositing the metal, conductive material is formed in the TAV openings directly against the deposited metal and therefrom a TAV is formed in individual of the TAV openings that comprises the conductive material and the deposited metal. Structure embodiments are disclosed.

8 Claims, 39 Drawing Sheets

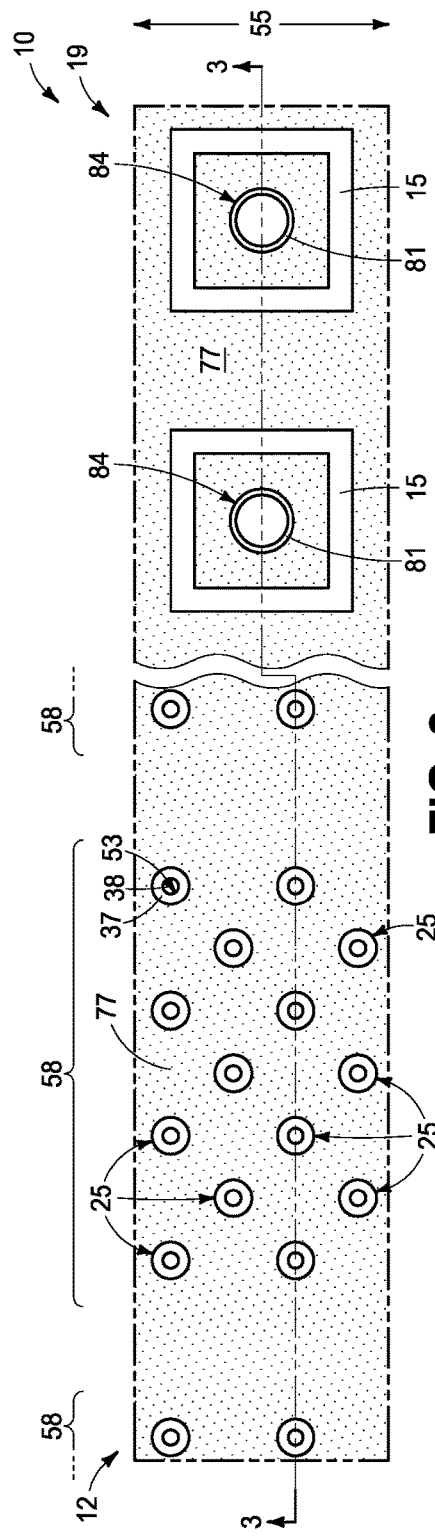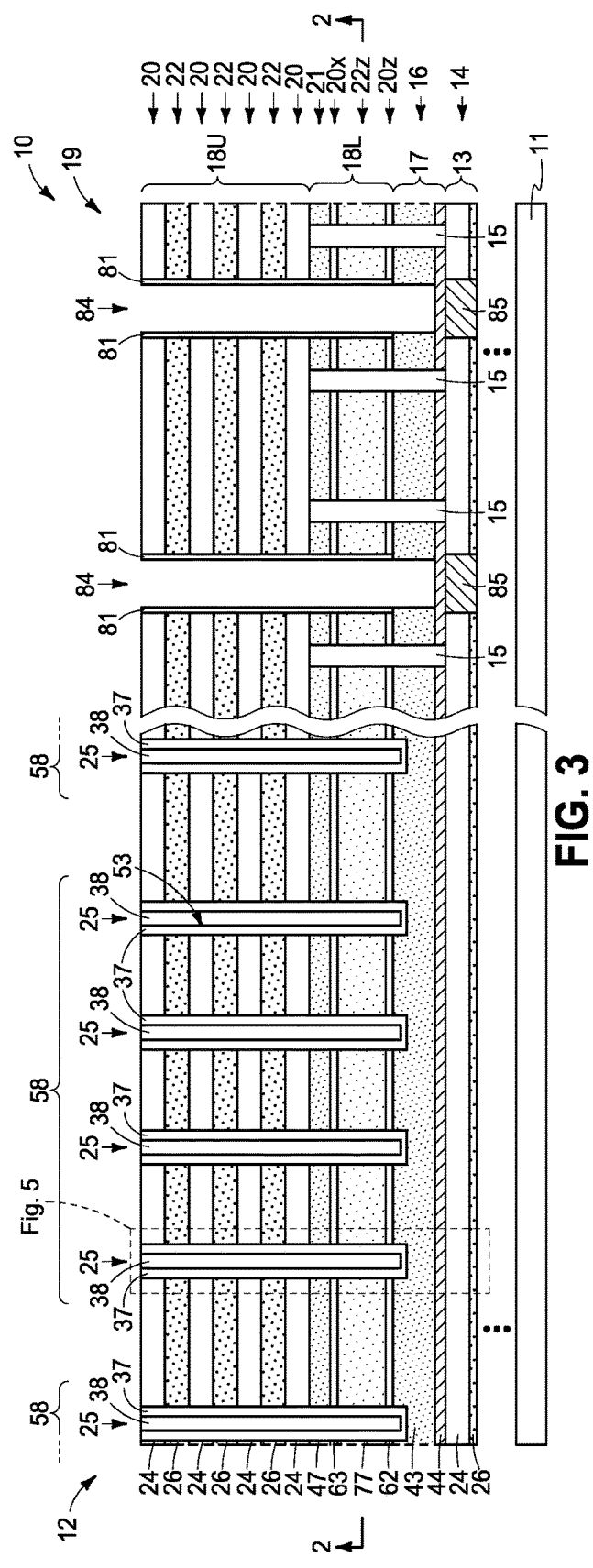

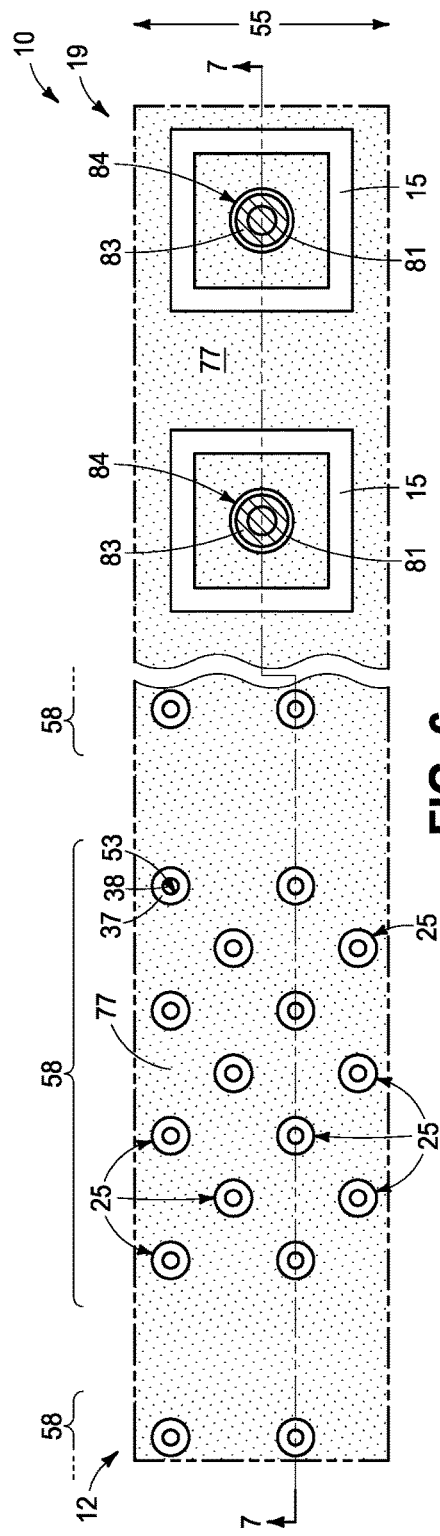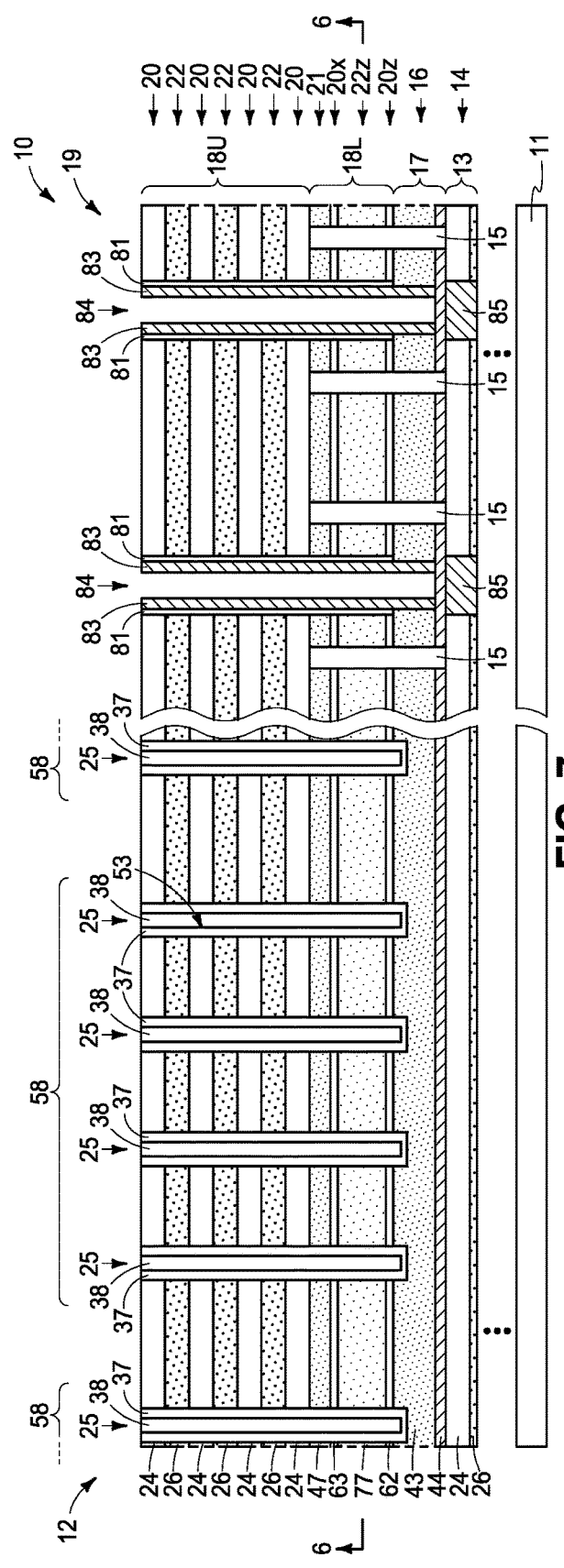

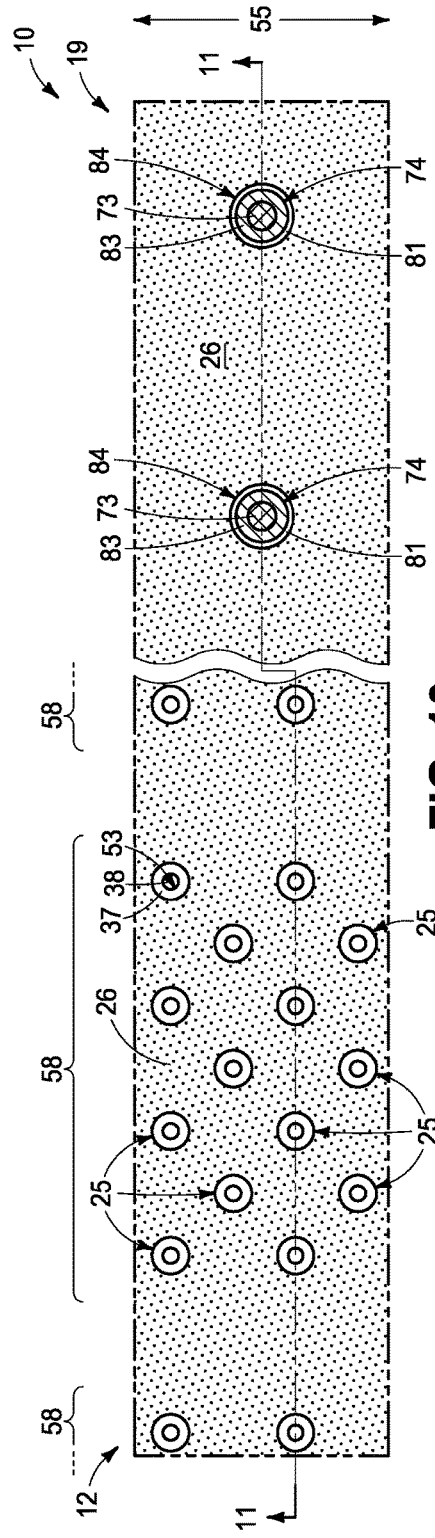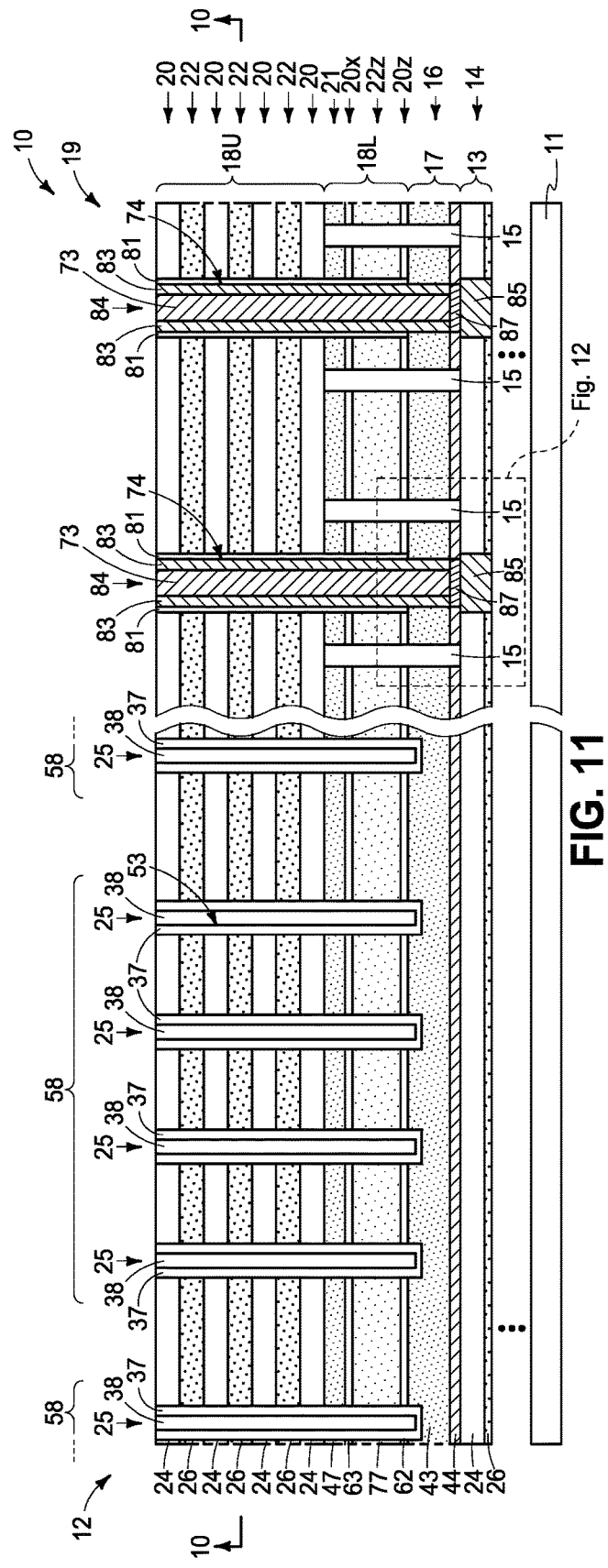

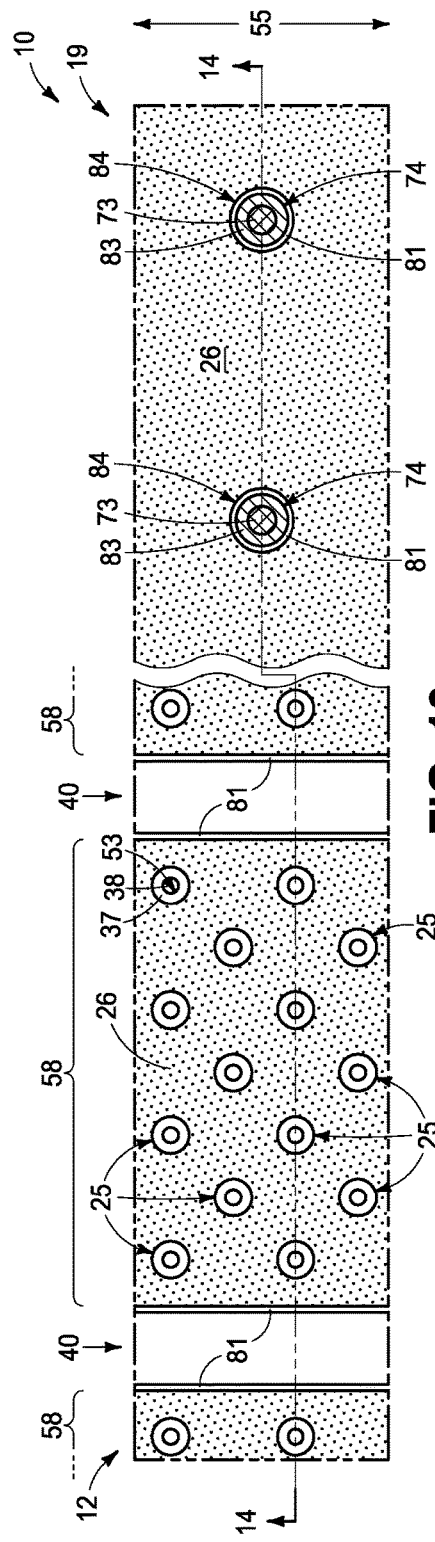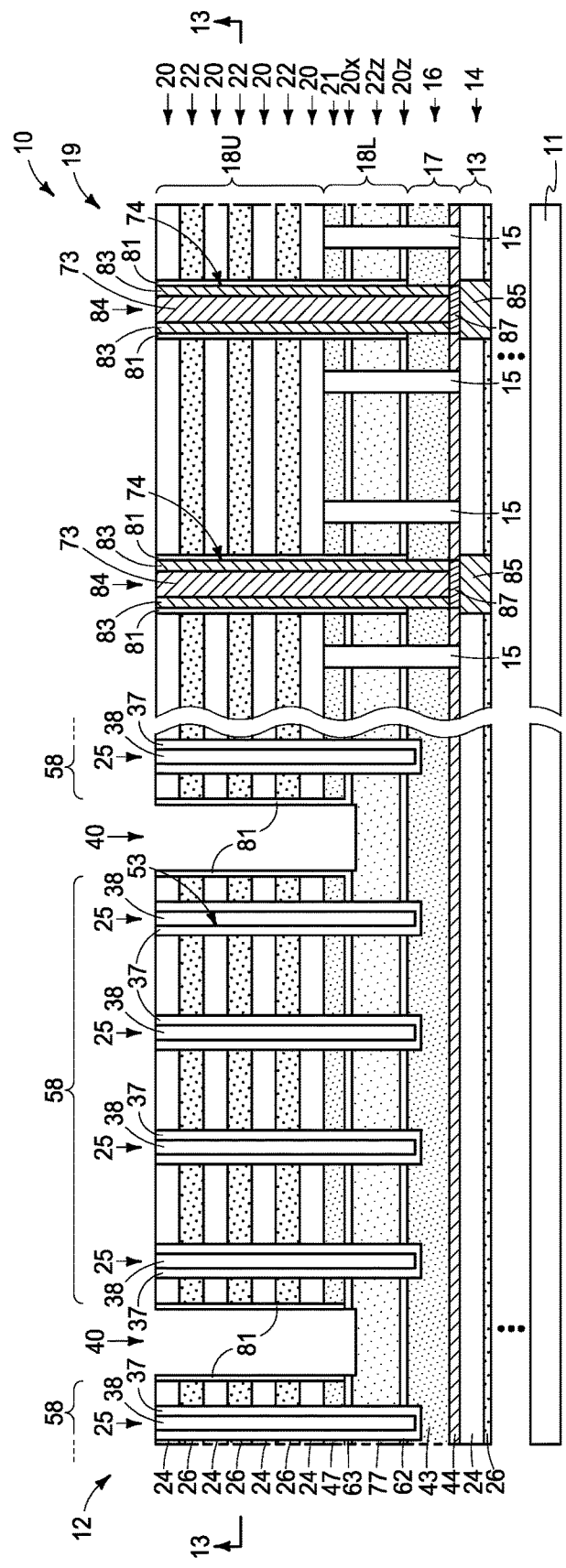

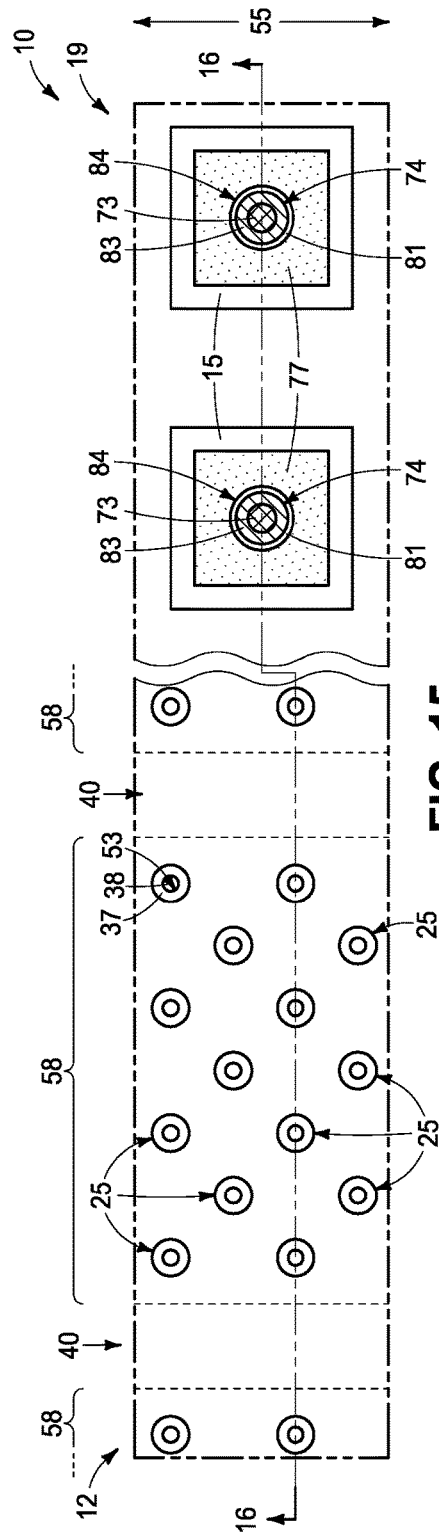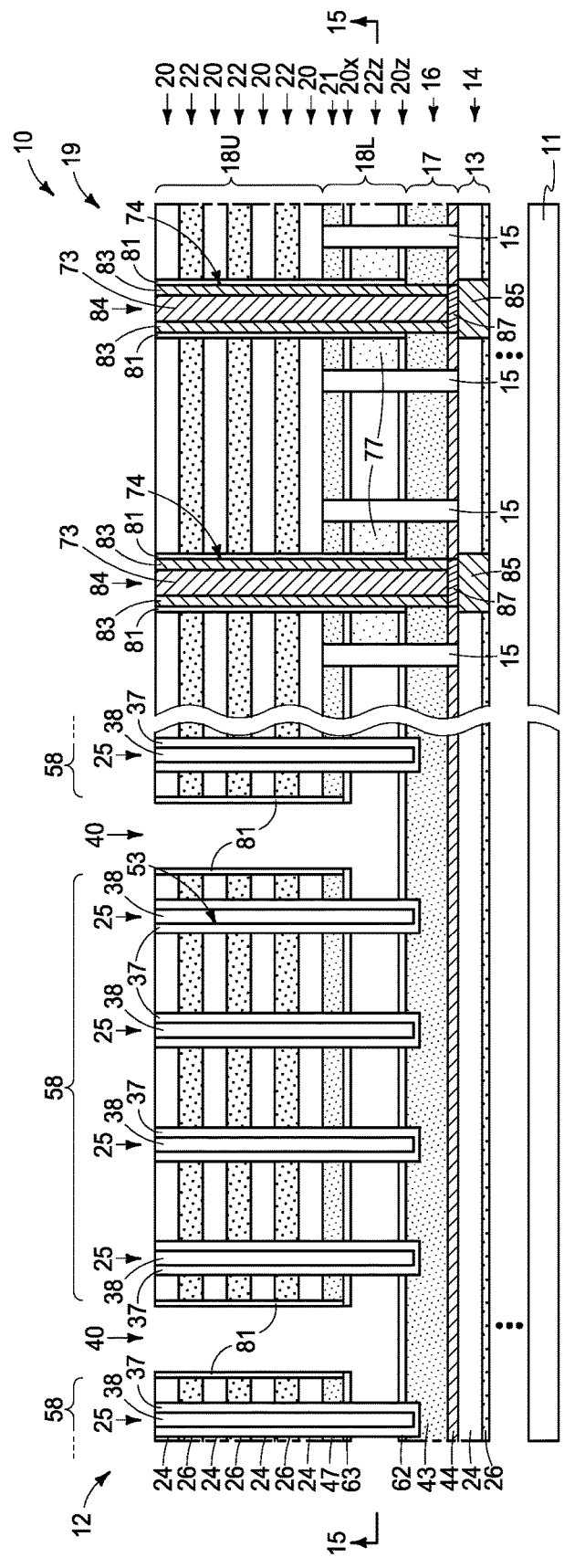

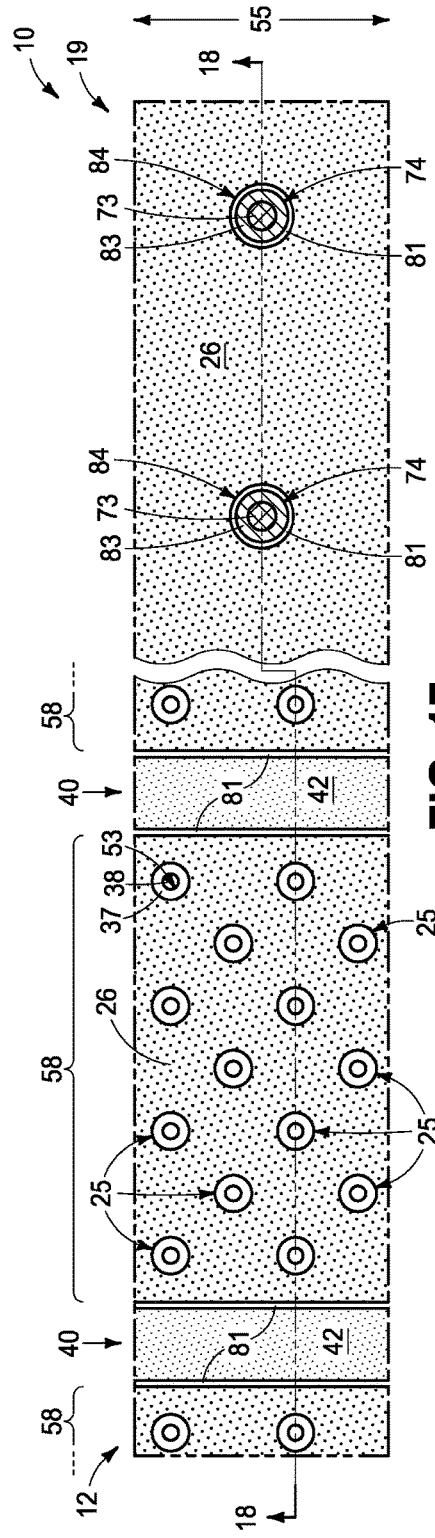
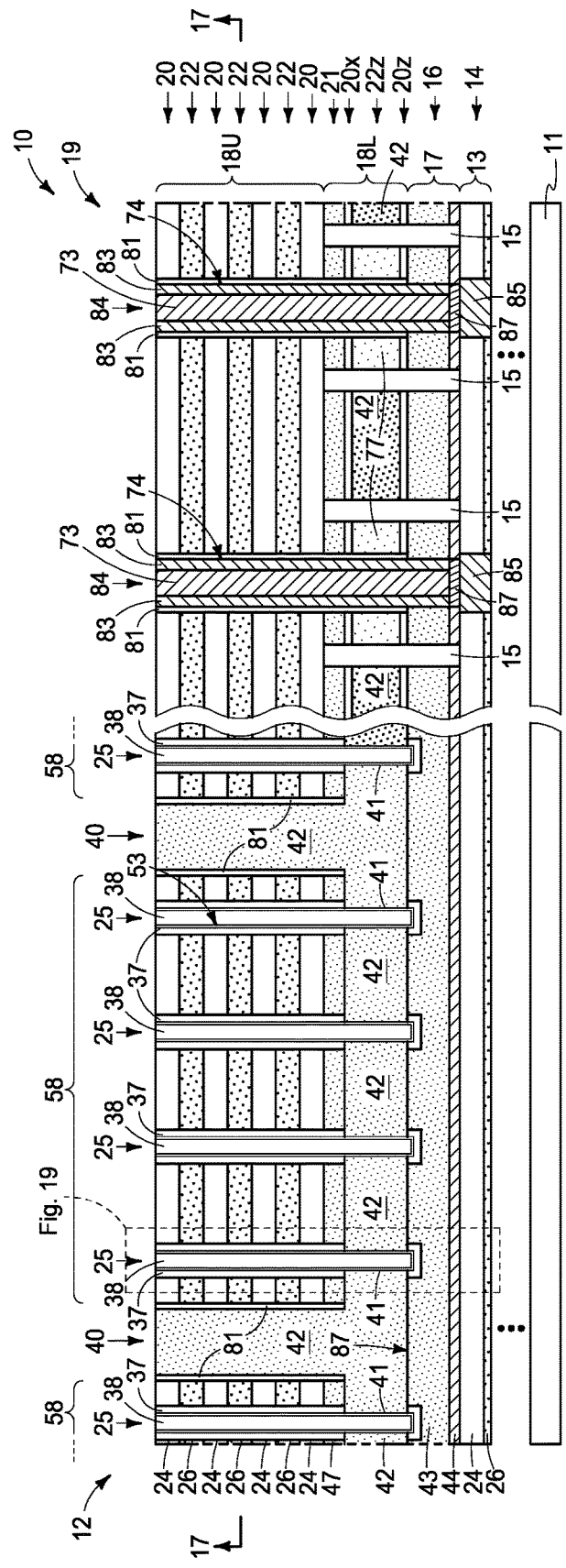

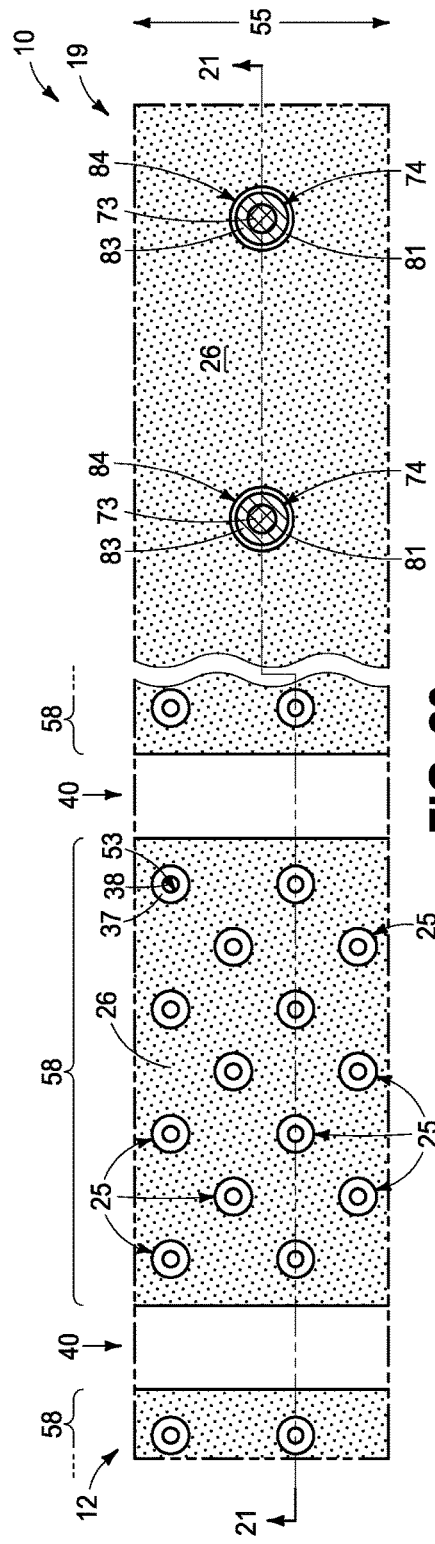
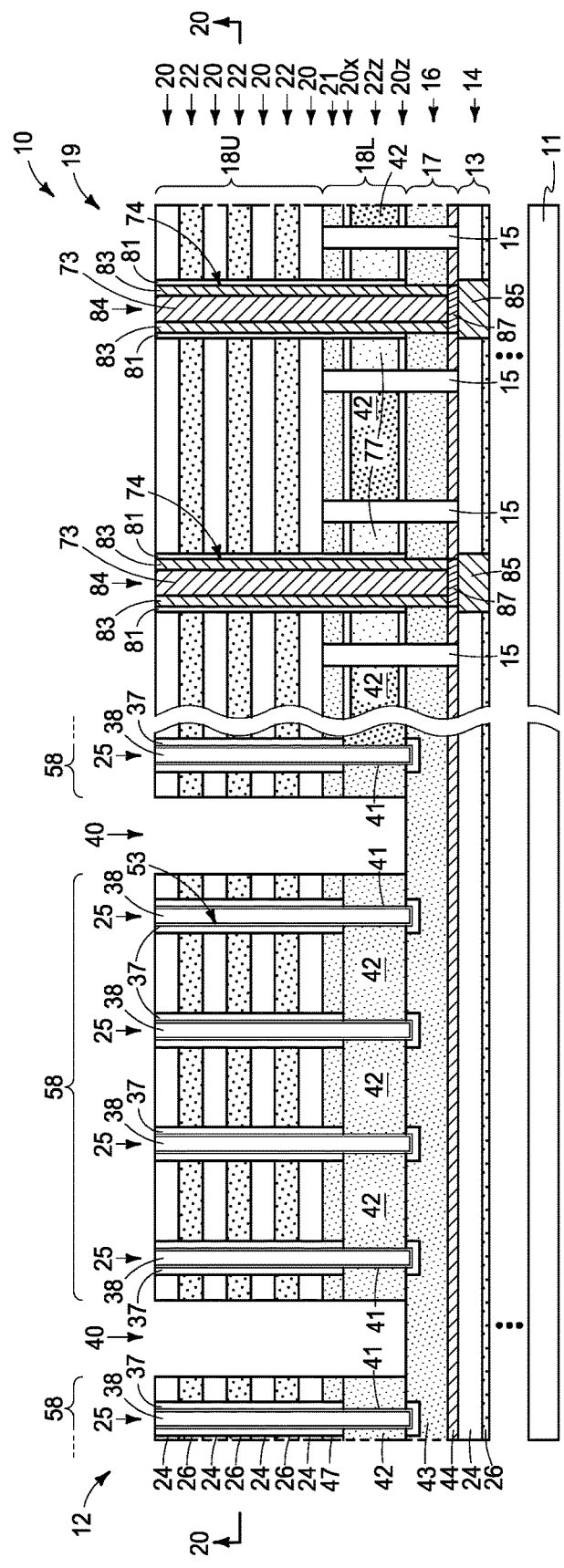

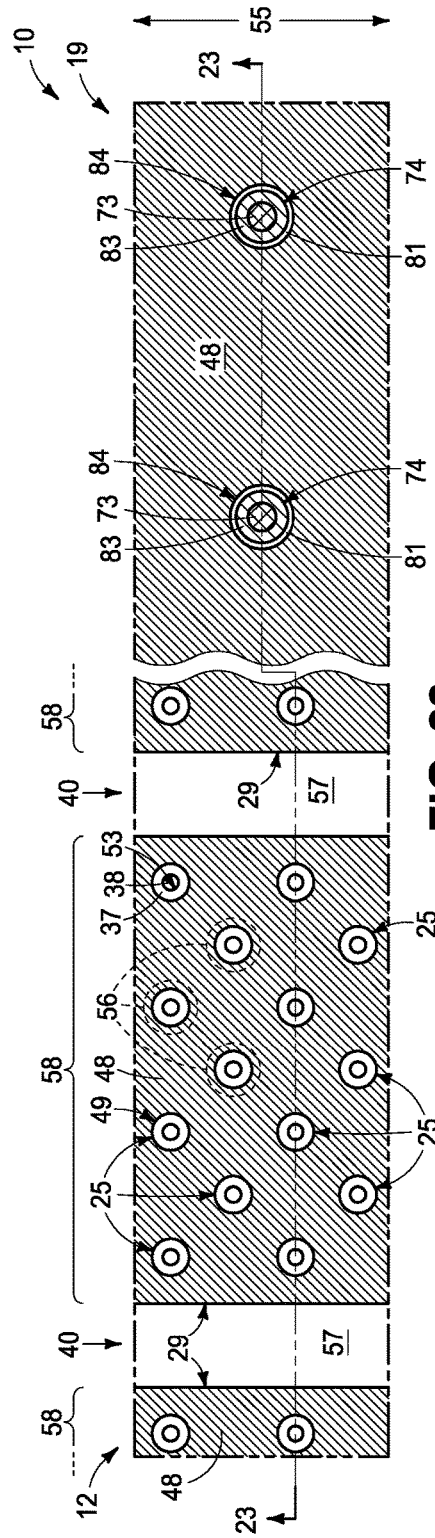
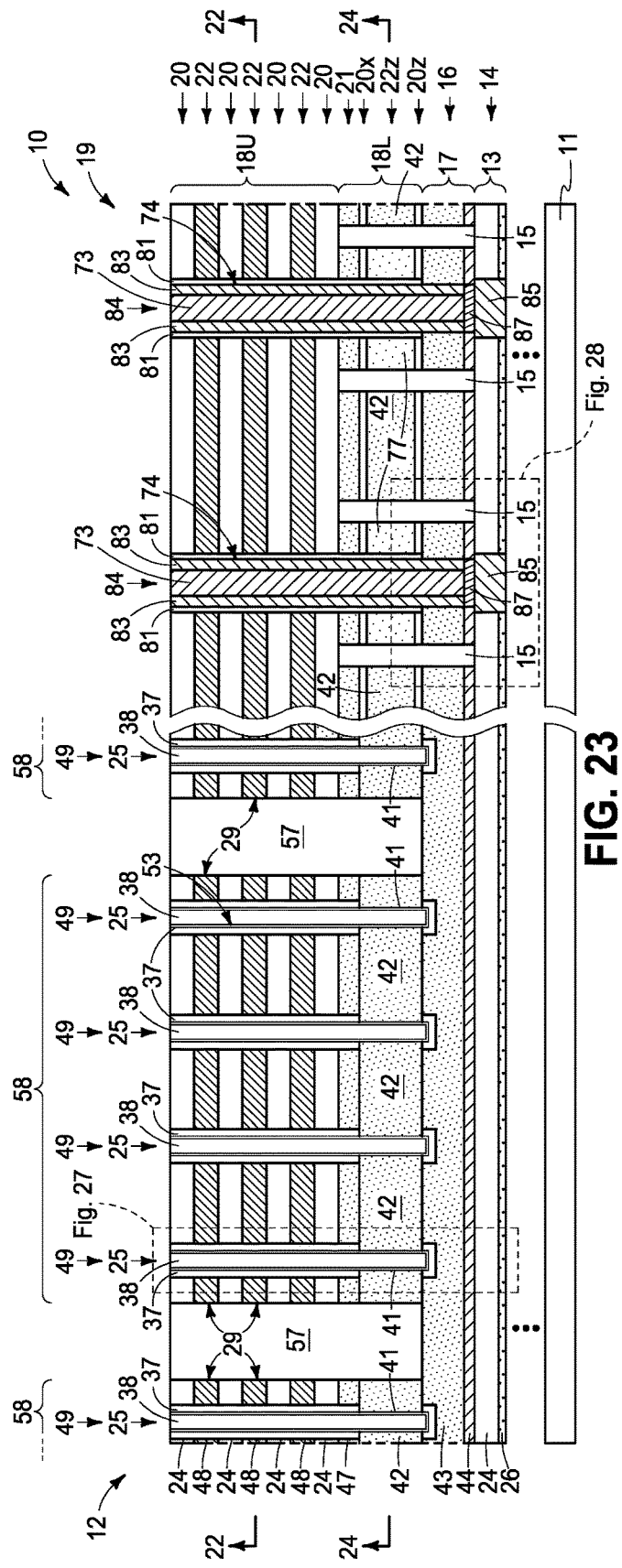
FIG. 22
FIG. 23

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region therebetween. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 2-5 are diagrammatic cross-sectional views of portions of a construction (e.g., as part of FIG. 1) that will comprise an array of elevationally-extending strings of memory cells in accordance with an embodiment of the invention.

FIGS. 6-68 are diagrammatic sequential sectional and/or enlarged views of the construction of FIGS. 2-5, or portions thereof or alternate and/or additional embodiments, in process in accordance with some embodiments of the invention.

DETAILED DESCRIPTION OF EXAMPLE EMBODIMENTS

Figure 68:
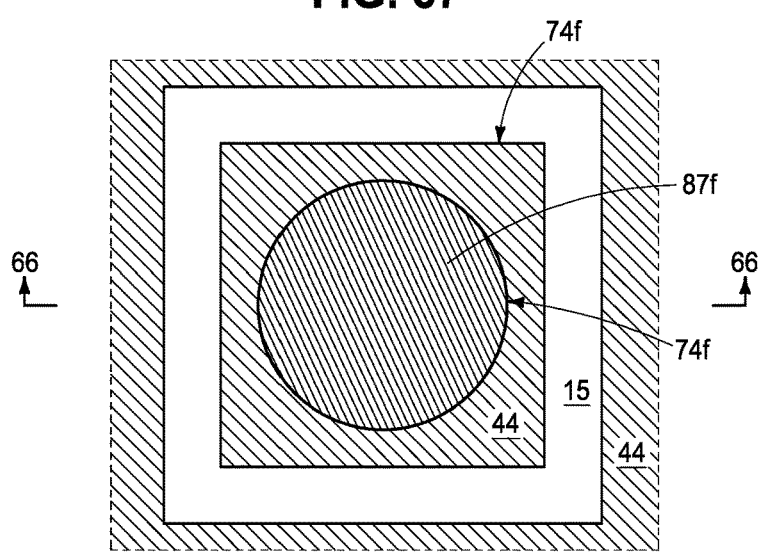

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are described with reference to FIGS. 1-68 which may be considered as a "gate-last" or "replacement-gate" process. Further, and regardless, the following sequence of processing steps is but one example and other sequences of the example processing steps (with or without other processing steps) may be used regardless of whether using "gate-last/replacement-gate" processing.

Figure 1:
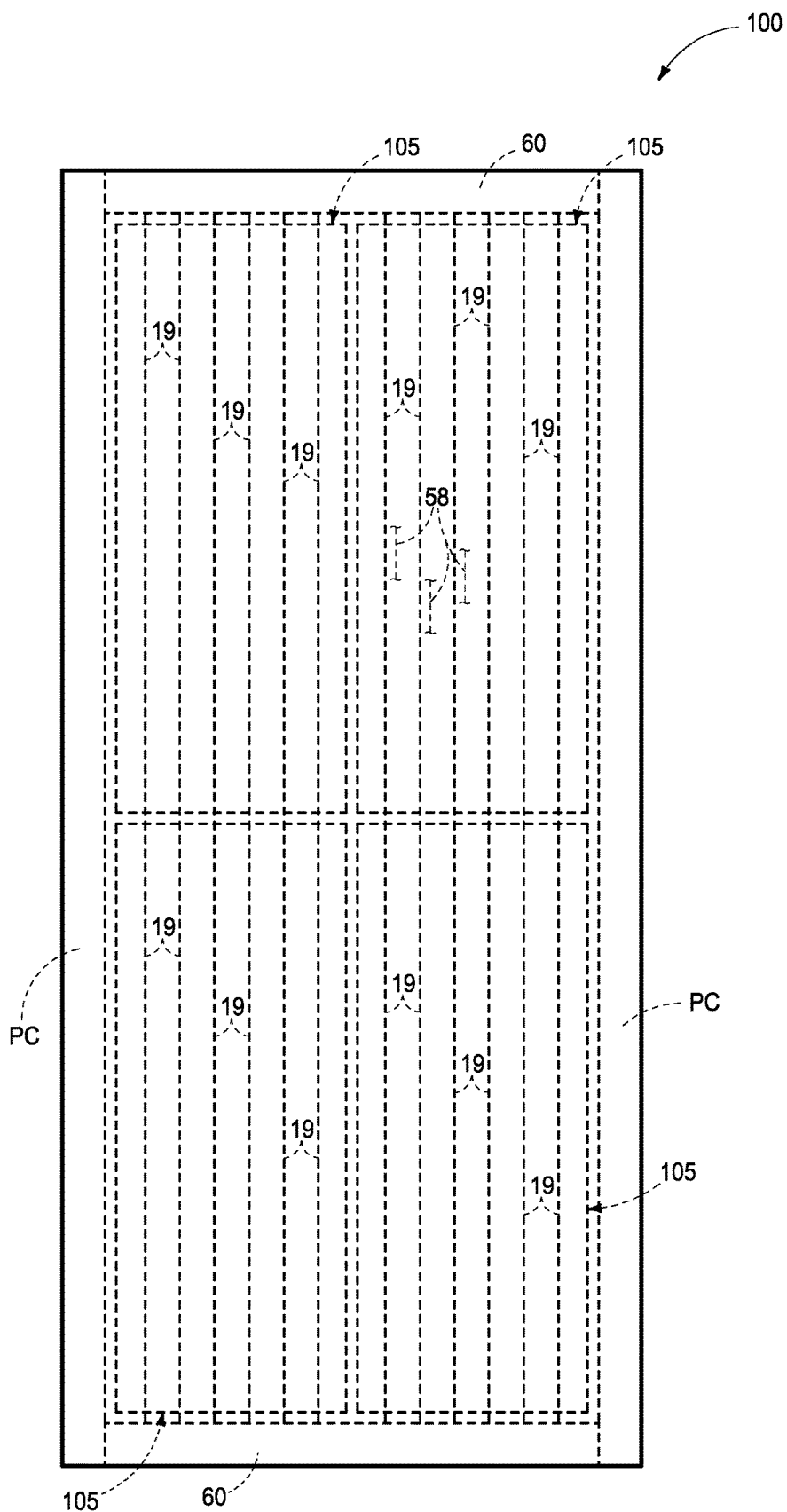
FIG. 1 is a diagrammatic top plan view of a die or die area that may be part of a larger substrate (e.g., a semiconductor wafer, and not shown).
Figure 4:
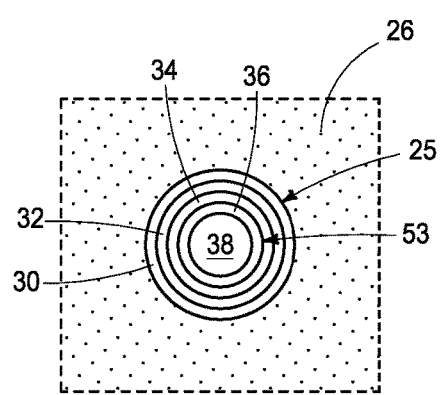
Figure 5:
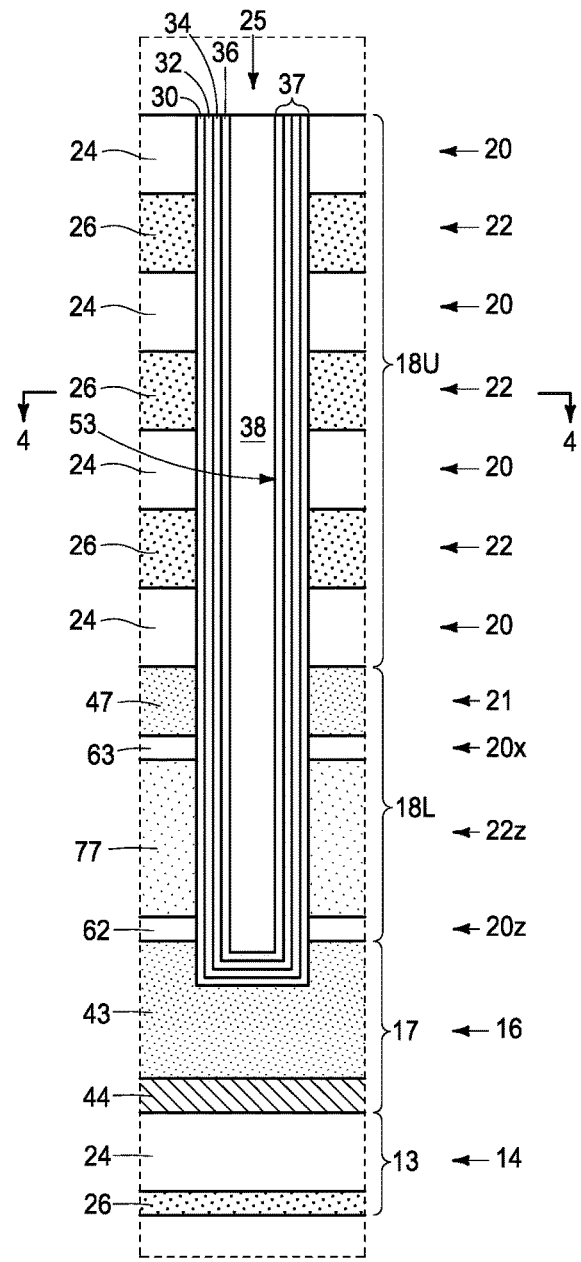

FIG. 1 shows an example diagrammatic embodiment comprising a die or die area 100 that may be part of a larger substrate (e.g., a semiconductor wafer, and not shown) and within which a memory array will be fabricated. Example die area 100 comprises at least one memory-plane region 105 (four being shown), memory-block regions 58 in individual memory-plane regions 105, a stair-step region 60 (two being shown at longitudinal ends of the memory planes), and a peripheral circuitry region PC (two being shown). In this document, "block" is generic to include "sub-block". Alternate orientations may be used, for example having a stair-step region between immediately-adjacent memory planes (not shown). Regions 105, 58, 60, and/or PC may not be discernable at this point of processing. FIGS. 2-5 are diagrammatic larger and varied scale views of portions of die area 100.

Referring to FIGS. 2-5, a construction 10 is shown in a method of forming an array or array region 12 of elevationally-extending strings of transistors and/or memory cells (not yet fabricated) and in forming a through-array-via (TAV) region 19. A "TAV region" is a region in which operative TAVs are present or will be formed. An "operative TAV" is a circuit-operative conductive interconnect extending through a stack and between electronic components at different elevations in a finished construction of integrated circuitry that has been or is being fabricated (e.g., through a stack 18* described below; an * being used as a suffix to be inclusive of all such same-numerically-designated components that may or may not have other suffixes). A TAV region may also contain one or more dummy TAVs (i.e., a circuit-inoperative structure extending through a stack 18* in a finished construction of integrated circuitry that has been or is being fabricated). Example TAV region 19 may be in individual memory planes 105 (i.e., in-plane; e.g., FIG. 1) or be out-of-plane (i.e., outside of a memory-plane region [not shown]; e.g., edge-of-plane or in a stair-step region 60). By way of example only, example in-plane TAV regions 19 are so-designated in FIG. 1. The discussion proceeds with respect to a single TAV region 19, although likely multiple TAV regions to which the invention is applicable will exist and whether those multiple TAV regions are in-plane, out-of-plane, and/or a combination of in-plane and out-of-plane. A TAV region may be in a memory-block region (not shown).

Example construction 10 comprises a base substrate 11 comprising conductive/conductor/conducting, semiconductive/semiconductor/semiconducting, and/or insulative/insulator/insulating (i.e., electrically herein) materials. Various materials have been formed elevationally over base substrate 11. Materials may be aside, elevationally inward, or elevationally outward of the FIGS. 2-5—depicted materials. For example, other partially or wholly fabricated components of integrated circuitry may be provided somewhere above, about, or within base substrate 11. Control and/or other peripheral circuitry for operating components in an array (e.g., array 12 or memory-array region 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

In one embodiment, an insulator tier 14 comprising insulator material 13 has been formed above substrate 11 (e.g., comprising different composition materials 26 and 24, for example silicon nitride and silicon dioxide, respectively). A conductor tier 16 comprising silicon-containing material has been formed directly above insulator tier 14. Conductor tier 16 comprises example conductor material 17 which as shown comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., silicon-containing material; e.g., conductively n-type-doped or conductively p-type-doped polysilicon). In one embodiment, lower conductor material 44 comprises silicon-containing material 44 (e.g., metal material such as a metal silicide; e.g., $WSi_x$). Conductor tier 16 may comprise part of control circuitry (e.g., peripheral-under-array circuitry and/or a common source line or plate) used to control read and write access to the transistors and/or memory cells that will be formed within array 12. In one embodiment, TAV region 19 comprises lower vias 85 (e.g., metal material) that individually extend through insulator tier 14 and directly electrically couple to circuitry there-below (not material to the invention and not shown). Lower vias 85 may include or have an insulative lining there-about (e.g., silicon dioxide and/or silicon nitride and not shown)

A stack 18* comprising vertically-alternating first tiers 22* (alternately referred to as conductive tiers) and second tiers 20* (alternately referred to as insulative tiers) has been formed directly above conductor tier 16, with stack 18* comprising laterally-spaced memory-block regions 58 and through-array-via (TAV) region 19. Laterally-spaced memory-block regions 58 will comprise laterally-spaced memory blocks 58 in a finished circuitry construction. Memory-block regions 58 and resultant memory blocks 58 (not yet shown) may be considered as being longitudinally elongated and oriented, for example horizontally-parallel relative one another, along a direction 55. In one embodiment, stack 18* comprises a lower portion 18L directly above conductor tier 16 and an upper portion 18U directly above lower portion 18L.

First tiers 22* when conductive tiers may not comprise conducting material and second tiers 20* when insulative tiers may not comprise insulative material or be insulative at this point in processing in conjunction with the hereby initially-described example method embodiment which is "gate-last" or "replacement-gate". Example lower portion 18L comprises a lowest tier 20z of second tiers 20* directly above (e.g., directly against) conductor material 17. Example lowest second tier 20z is insulative and may be sacrificial (e.g., in array region 12; e.g., comprising material 62, for example silicon dioxide and/or silicon nitride). A next-lowest second tier 20x of second tiers 20* is directly above lowest second tier 20z and may be sacrificial (e.g., in array region 12; e.g., comprising material 63, for example silicon dioxide and/or silicon nitride). A lowest tier 22z of first tiers 22* comprising sacrificial material 77 (e.g., polysilicon or silicon nitride) is vertically between lowest second tier 20z and next-lowest second tier 20x. Example lower portion 18L comprises a conducting-material tier 21 comprising conducting material 47 (e.g., conductively-doped polysilicon) that is directly above next-lowest second tier 20x. Additional tiers may be present. For example, one or more additional tiers may be above tier 21 (tier 21 thereby not being the uppermost tier in portion 18L, and not shown), between tier 21 and 20x (not shown), and/or below tier 22z (other than 20z not being shown). In one embodiment, insulative material 15 (e.g., silicon dioxide, silicon nitride, and/or aluminum oxide) has been formed vertically through lower portion 18L of stack 18* in TAV region 19 circumferentially around horizontal locations where individual TAVs will be formed.

Example upper portion 18U comprises vertically-alternating different composition first tiers 22 and second tiers 20. Example first tiers 22 and second tiers 20 comprise different composition materials 26 and 24 (e.g., silicon nitride and silicon dioxide), respectively. Example upper portion 18U is shown starting above lower portion 18L with a second tier 20 although such could alternately start with a first tier 22 (not shown) or tier 21 may be considered as being in upper portion 18U (not so designated). Further, and by way of example, lower portion 18L may be formed to have one or more first and/or second tiers as a top thereof. Regardless, only a small number of tiers 20 and 22 is shown, with more likely upper portion 18U (and thereby stack 18*) comprising dozens, a hundred or more, etc. of tiers 20 and 22. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22 and/or above an uppermost of conductive tiers 22. For example, one or more select gate tiers (not shown) may be between conductor tier 16 and lowest conductive tier 22 and one or more select gate tiers may be above an uppermost of conductive tiers 22. Alternately or additionally, at least one of the depicted uppermost and lowest conductive tiers 22 may be a select gate tier.

Channel openings 25 have been etched through upper portion 18U and lower portion 18L of stack 18* in laterally-spaced memory-block regions 58. Channel openings 25 may taper radially-inward or radially-outward (not shown) moving deeper into stack 18*. Channel openings 25 may go into conductor material 17 of conductor tier 16 as shown or may stop there-atop (not shown). Alternately, as an example, channel openings 25 may stop atop or within the lowest second tier 20z. A reason for extending channel openings 25 at least to conductor material 17 of conductor tier 16 is to provide an anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial.

Transistor channel material may be formed in the individual channel openings elevationally along the insulative tiers and the conductive tiers, thus comprising individual channel-material strings, which is directly electrically coupled with conductor material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

In one embodiment as shown, charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and in individual openings 25 followed by planarizing such back at least to a top surface of stack 18*.

Channel material 36 as a channel-material string 53 has also been formed in channel openings 25 elevationally along insulative tiers 20 and conductive tiers 22 in memory-block regions 58. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 or may occur with respect to only some. Alternately, and by way of example only, no punch etching may be conducted and channel material 36 may be directly electrically coupled to conductor material 17 of conductor tier 16 only by a separate conductive interconnect (not yet shown). A radially-central solid dielectric material 38 (e.g., spin-on-dielectric, silicon dioxide, and/or silicon nitride) is shown in channel openings 25. Alternately, and by way of example only, the radially-central portion in channel openings 25 may include void space(s) (not shown) and/or be devoid of solid material (not shown).

Stack 18* comprises TAV openings 84 (e.g., formed by anisotropic etching) in TAV region 19 that extend to silicon-containing material (e.g., 43 and/or 44) in individual horizontal locations where individual TAVs will be formed. TAV openings 84 may taper radially-inward or radially-outward moving deeper into stack 18* (neither being shown). In one embodiment and as shown, TAV openings 84 extend through silicon-containing material 43 to silicon-containing material 44. An example manner of forming example TAV openings 84 is to initially form openings 84 to stop atop conductor tier 16, thereafter forming an insulative lining 81 therein (e.g., hafnium oxide, aluminum oxide, multiple layers of silicon dioxide and silicon nitride, etc.), followed by punch-etching thereof to substantially remove it from being over horizontal surfaces, and thereafter continue etching of TAV openings 84 to silicon-containing material 44. Material 26 of first tiers 22 may be radially/laterally etched from within TAV openings 84 before forming insulative lining 81 (when such is formed and not shown).

Referring to FIGS. 6 and 7, and in one embodiment, a radially-outer conductive lining 83 comprising a metal nitride (e.g., TiN, TaN, WN) has been formed in TAV openings 84. Conductive lining 83 will be radially-outward of a conductive core to be formed subsequently as described below. Conductive lining 83 may be formed, for example, by conformally depositing material of conductive lining 83 followed by a short punch-etching thereof to substantially remove it from being over horizontal surfaces and to upwardly-expose silicon-containing material 44.

Figure 8:
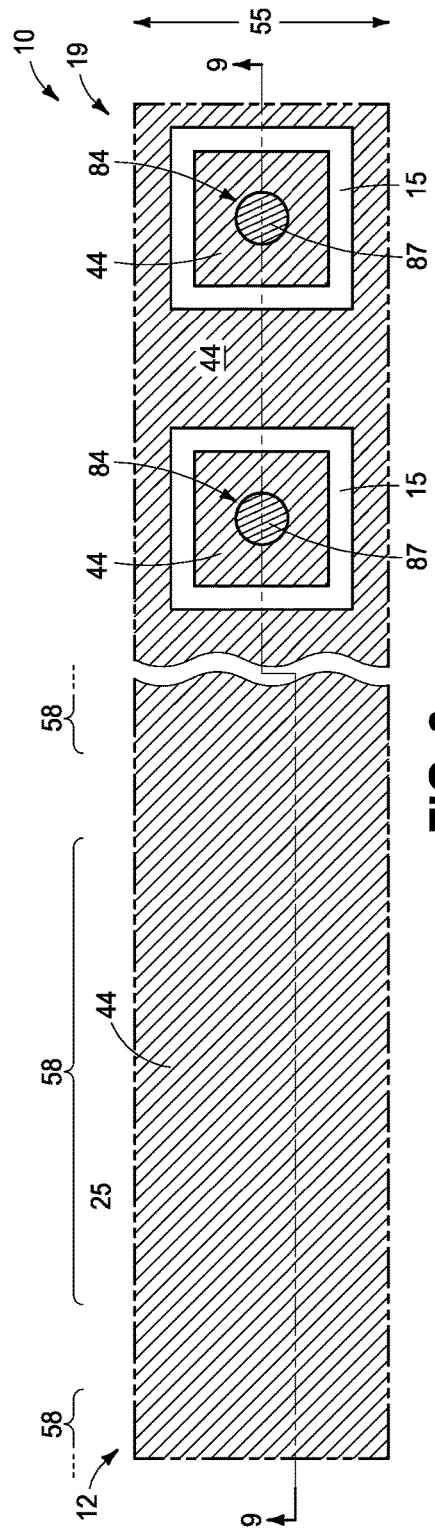
Figure 9:
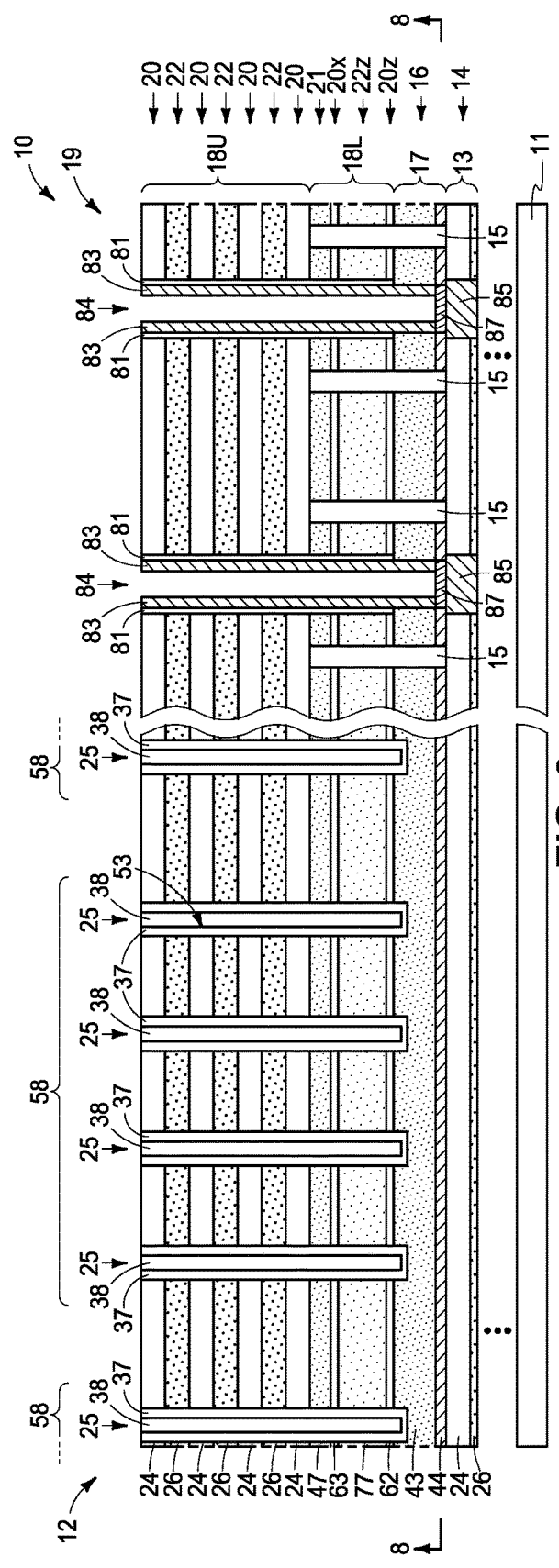

Referring to FIGS. 8 and 9, silicon of silicon-containing material 44 (e.g., Si of $WSi_x$) has been reacted with a metal halide to deposit metal 87 of the metal halide in conductor tier 16. By way of examples only, example metal halides are $WF_6$, $MoF_6$, $NbF_5$, and $TaF_5$, with metals thereof of course being W, Mo, Nb, and Ta, respectively. Additional examples are $WCl_6$, $MoCl_6$, $NbCl_5$, and $TaCl_5$. Silicon of the silicon-containing material may be removed as a gaseous compound of silicon and the halogen from the metal halide. Example conditions for the reacting include 200° C. to 700° C. and pressure of 1 mTorr to 760 Torr. In one ideal embodiment, the deposited metal 87 is at least primarily in elemental form (i.e., greater than 50 atomic percent up to and including 100 atomic percent elemental-form metal), although alternately or additionally may comprise at least one of an alloy of two or more elemental metal (e.g., if using a combination of different metal halides) or a metal compound (e.g., a metal silicide as described below).

Figure 12:
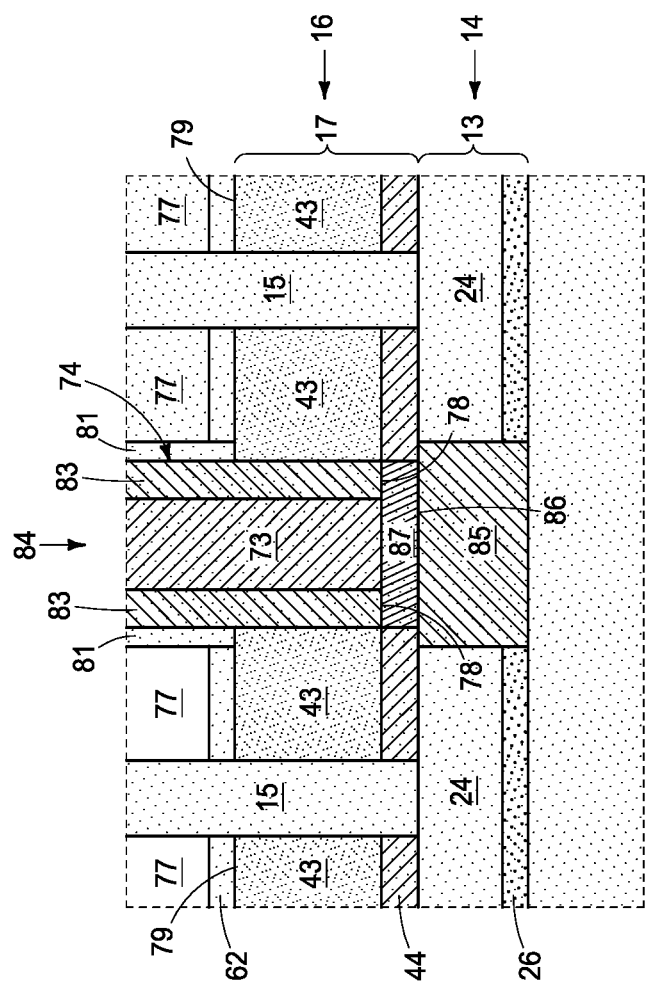

After depositing metal 87, conductive material is formed in TAV openings 84 directly against deposited metal 87 and a TAV is formed therefrom in individual TAV openings 84 that comprises the conductive material and the deposited metal (regardless of presence of conductive lining 83). For example, referring to FIGS. 10-12 and in one embodiment, a conductive core 73 has been formed radially-inward of and is of higher conductivity than radially-outer conductive lining 83 (e.g., conductive core 73 comprising elemental-form metal or an alloy of two or more elemental metals, and in one embodiment at least primarily being elemental-form metal). Conductive core 73 may be formed by depositing material thereof to overfill remaining volume of TAV openings 84, followed by planarizing such back at least to the top surface of stack 18*. Regardless, FIGS. 10-12 show a TAV 74 as having been formed in individual TAV openings 84 and which comprises conductive lining 83 and conductive core 73. In one such embodiment and as shown, radially-outer conductive lining 83 has a lowest surface 78 that is in and below a top surface 79 of conductor tier 16. Regardless, in one embodiment, individual TAVs 74 have a lowest surface 86 in conductor tier 16 that comprises elemental-form metal that is the metal from the metal halide. Regardless, in one embodiment, the conductive material comprises elemental tungsten of alpha phase (e.g., conductive core 73) and deposited metal 87 is at least primarily elemental tungsten of beta phase. When the bottom of insulative lining 81 stops atop or within conductor tier 16 as shown, conductor materials 43 and 44 might be considered as comprising part of TAV 74 whereas if the bottom of insulative lining 81 went to insulator tier 14 they would not (not shown).

Referring to FIGS. 13 and 14, and in one embodiment as shown, horizontally-elongated trenches 40 have been etched through upper portion 18U of stack 18* between laterally-spaced memory-block regions 58 to sacrificial material 77 of lowest first tier 22z. As one example, trenches 40 may initially be formed by etching materials 24, 26, and 47 (likely using different anisotropic etching chemistries) and that stops on or within material 63 of next-lowest second tier 20x. A thin sacrificial lining 81 (e.g., hafnium oxide, aluminum oxide, multiple layers of silicon dioxide and silicon nitride, etc.) may then be formed, followed by punch-etching there-through to expose material 63, and followed by punch-etching through material 63 to expose material 77. Alternately, and by way of example only, a sacrificial etch-stop line (not shown) having the same general horizontal outline as trenches 40 may individually be formed in conducting-material tier 21 (when present) directly above and in contact with material 63 of next-lowest second tier 20x before forming upper portion 18U. Trenches 40 may then be formed by etching materials 24 and 26 to stop on or within the material of the individual sacrificial lines, followed by exhuming remaining material of such sacrificial lines prior to forming thin sacrificial lining 81. One or more trenches 40 may be formed laterally directly against TAV region 19 (not shown) including, for example, partially there-within (not shown). Alternately, a trench 40 that is closest to TAV region 19 may be laterally spaced therefrom. Trenches may also be formed in TAV region 19 (e.g., trenches 40 may extend in to TAV region 19 and not shown). Regardless, trenches 40 and others so formed may taper laterally-inward or laterally-outward moving deeper into stack 18* (neither being shown).

Referring to FIGS. 15 and 16, and in one embodiment, an etching fluid (not shown) has been flowed into horizontally-elongated trenches 40 to isotropically etch material 77 from lowest conductive tier 22z at least in array region 12 (material 77 thereby not being shown). Such etching is ideally conducted selectively relative to other exposed materials, for example using liquid or vapor $H_3PO_4$ as a primary etchant where material 77 is silicon nitride or using tetramethyl ammonium hydroxide [TMAH] where material 77 is polysilicon. The artisan is capable of selecting other chemistries for other materials 77. Insulative lining 81 is ideally etch-resistant to the etching fluid used during the flowing. FIGS. 15 and 16 show an embodiment where material 77 has also been removed in TAV region 19 (material 77 thereby not being shown in TAV region 19 outside of insulative material 15). Whole, partial, or no removal of material 77 in TAV region 19 may be dependent upon presence, size, number, and positioning of any etch openings in TAV region 19 (e.g., trenches and none being shown) and/or lateral proximity of some trenches 40 to TAV region 19.

Figure 19:
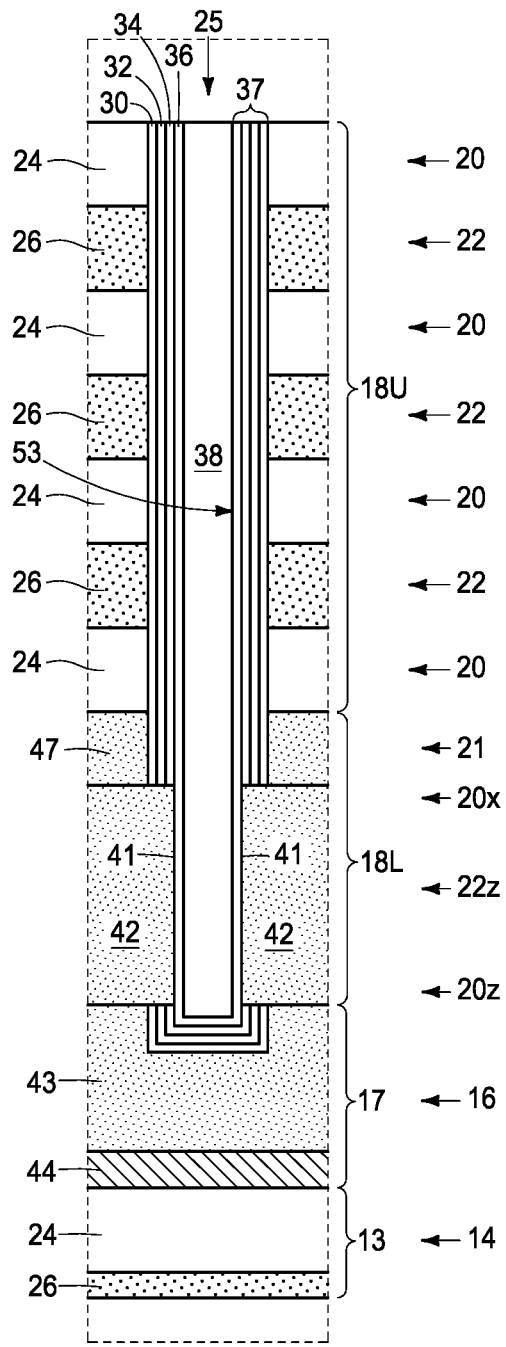
Figure 24:
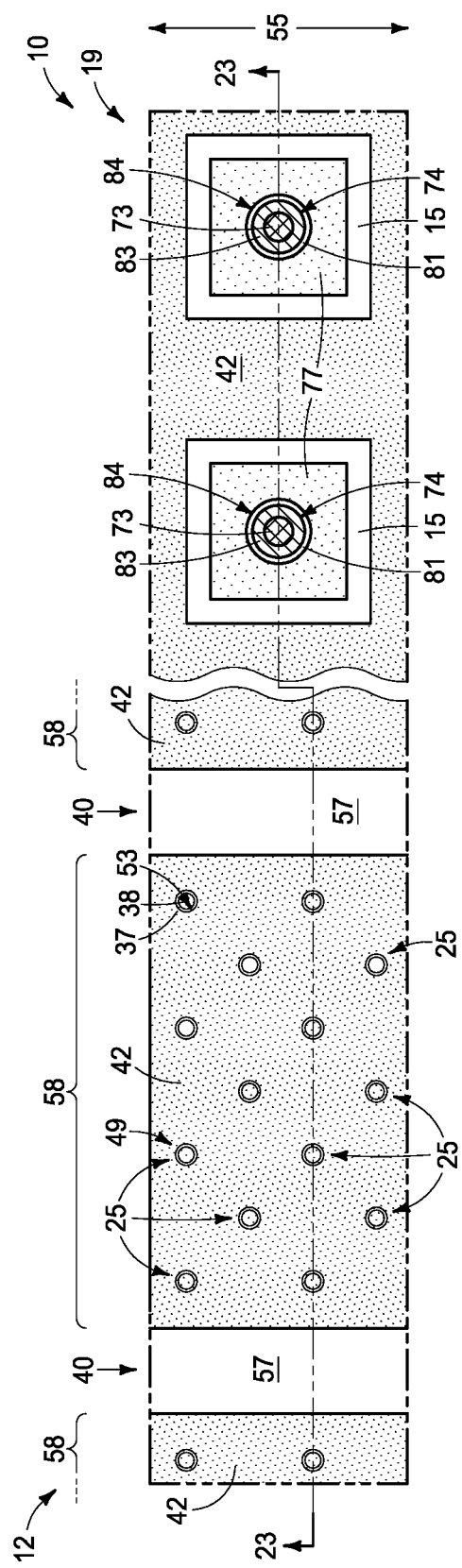
Figure 25:
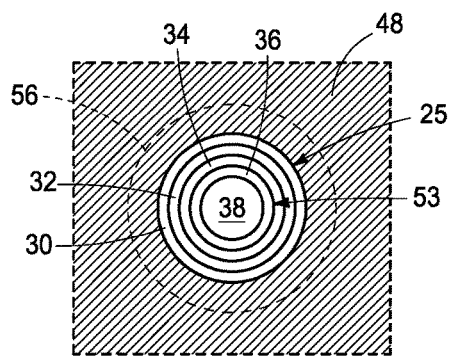
Figure 26:
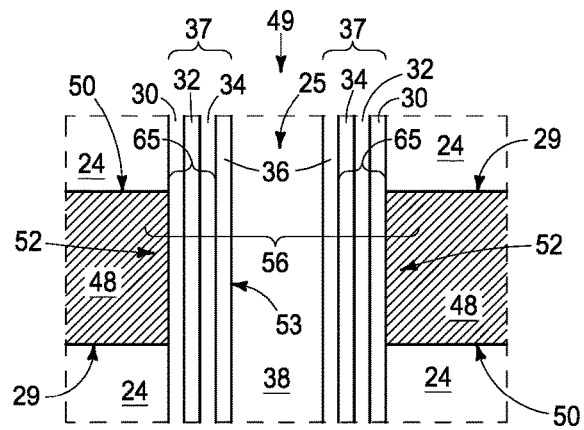
Figure 27:
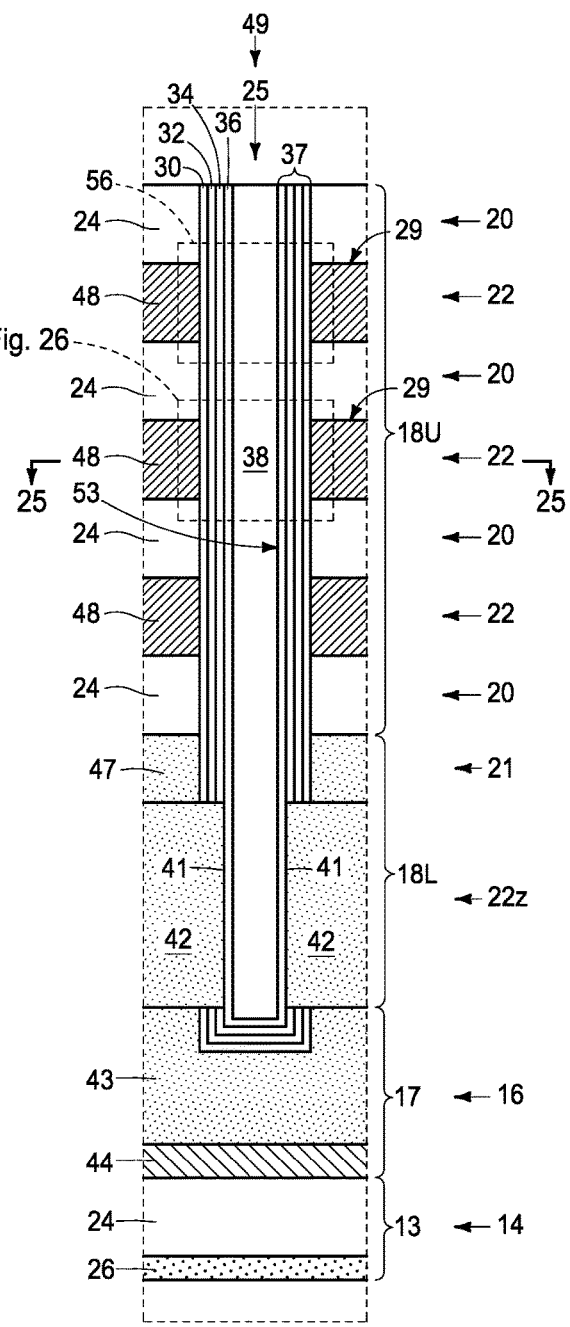
Figure 28:
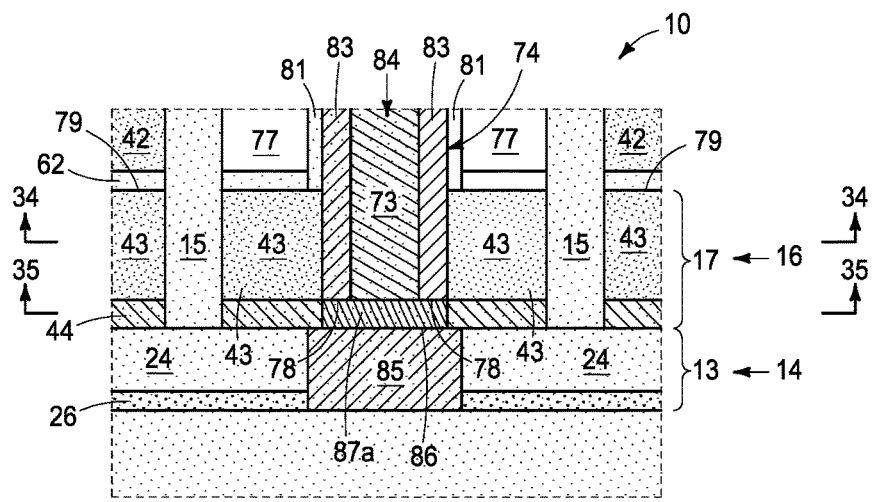
Figure 29:
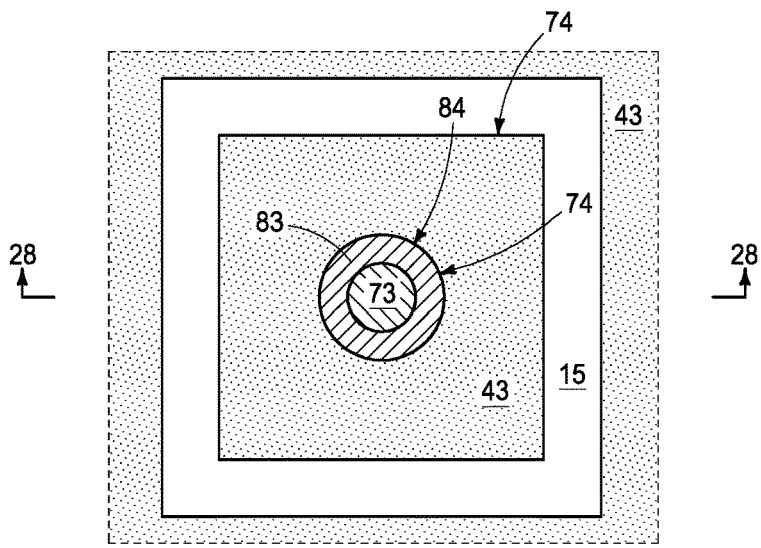
Figure 30:
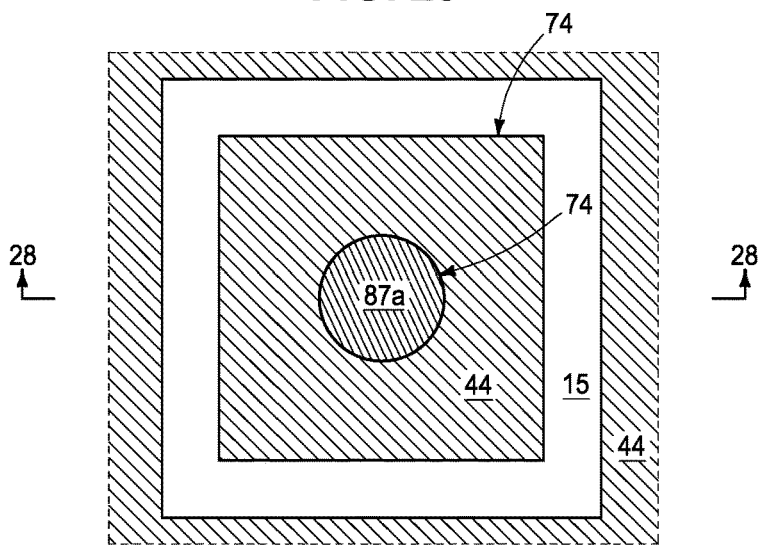
Figure 31:
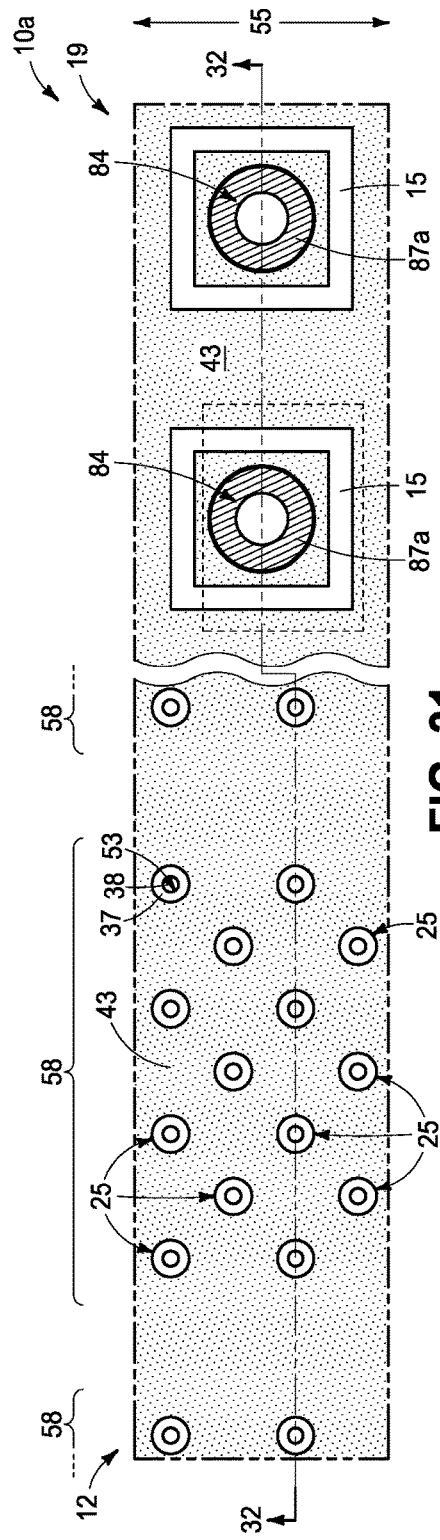
Figure 32:
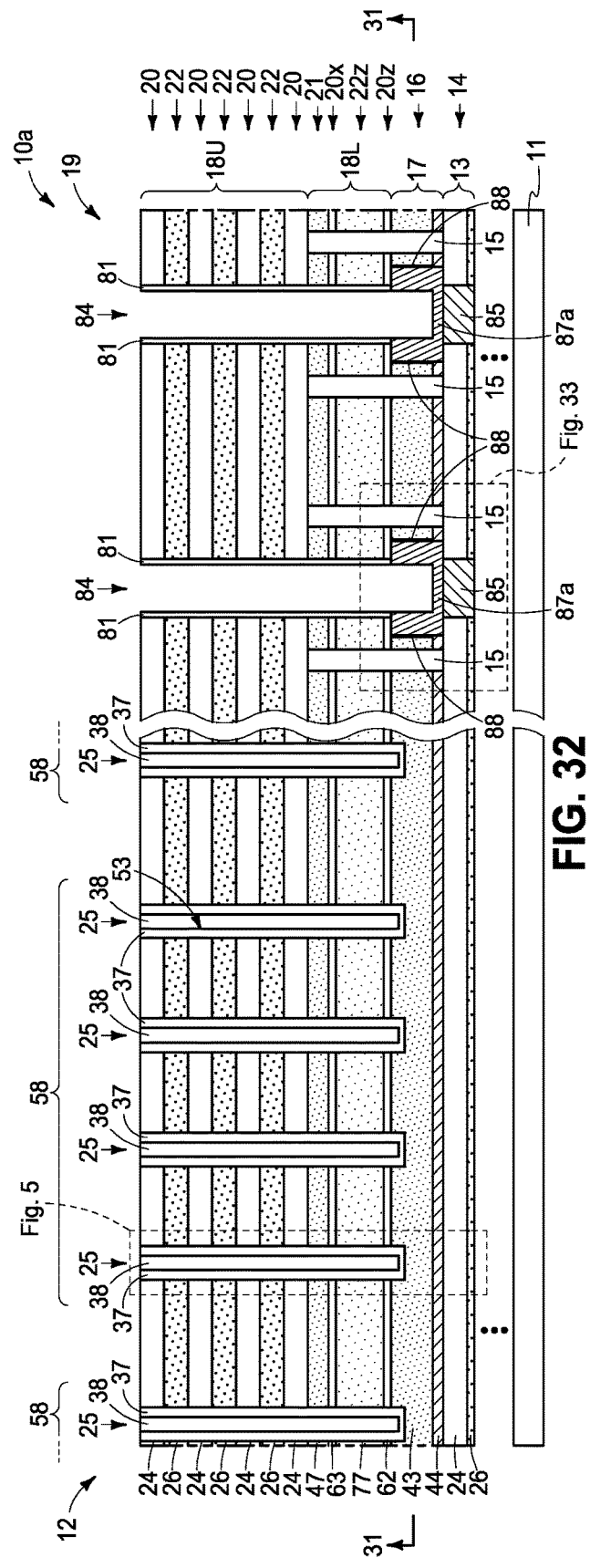
Figure 33:
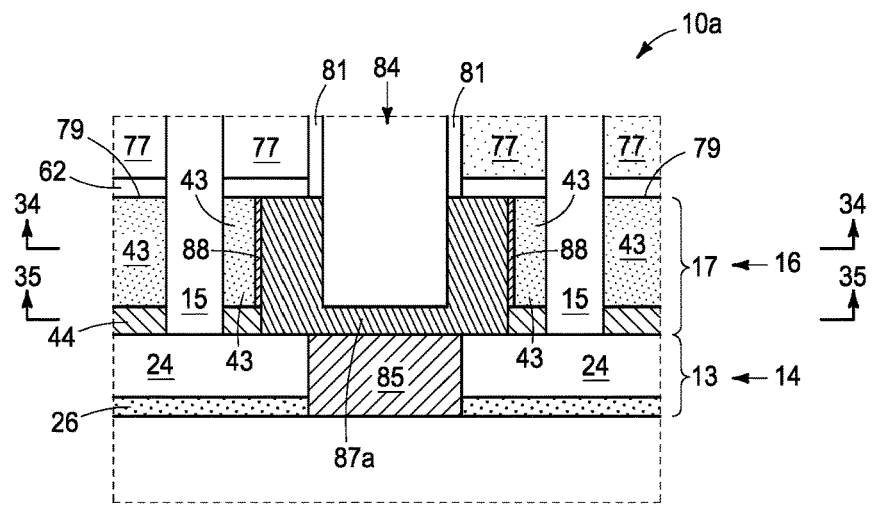
Figure 34:
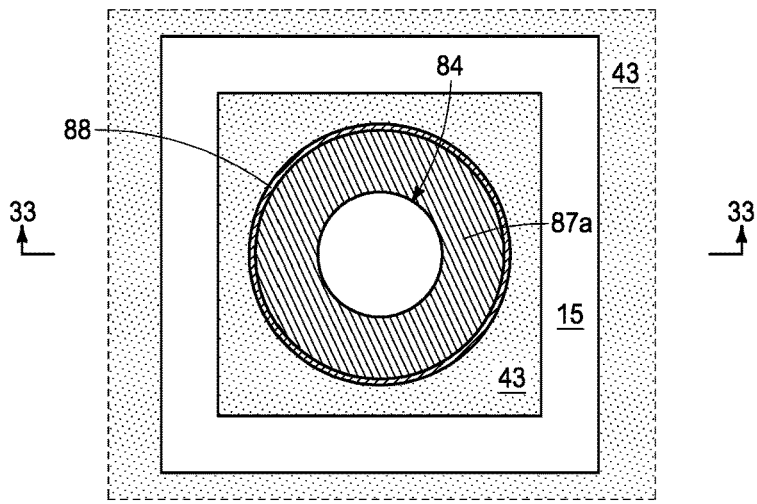
Figure 35:
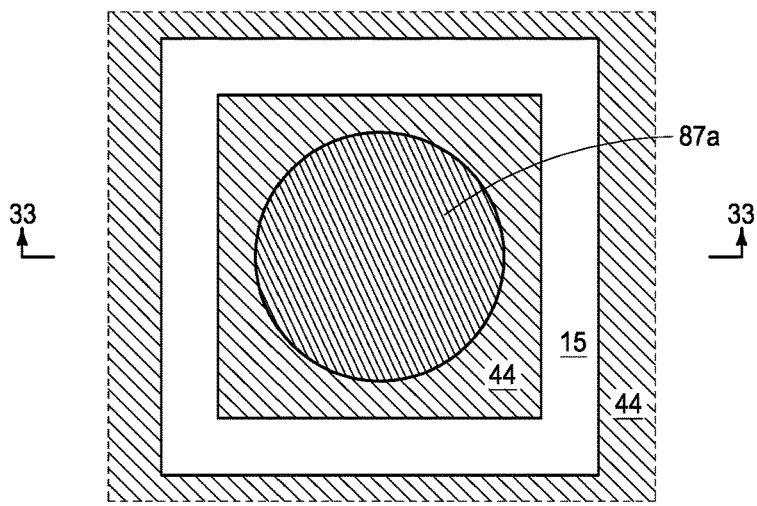
Figure 36:
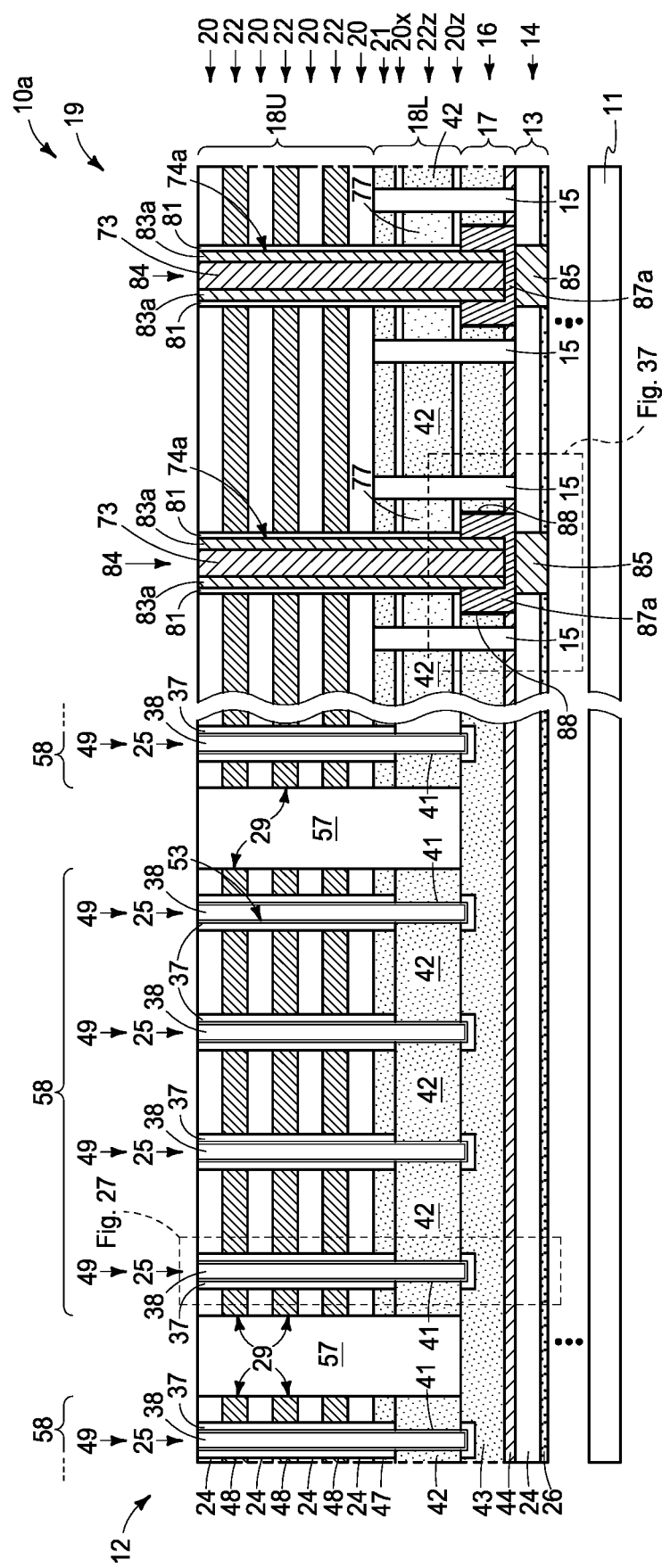
Figure 37:
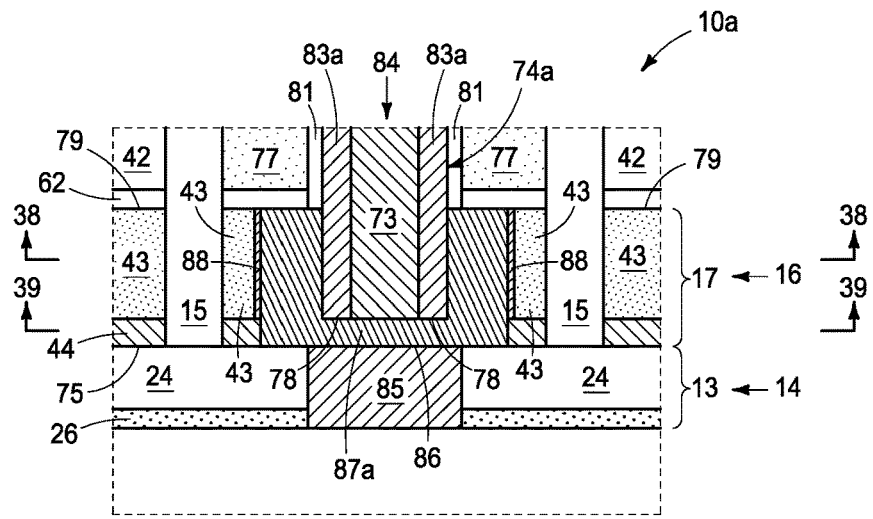
Figure 38:
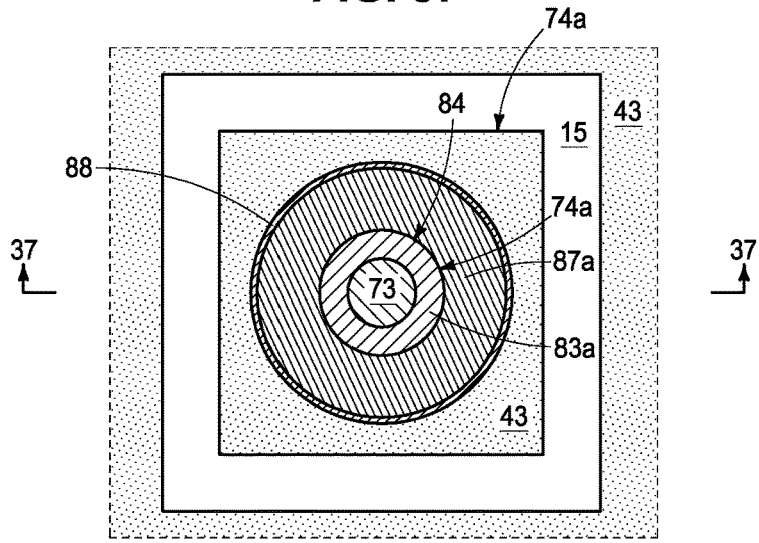
Figure 39:
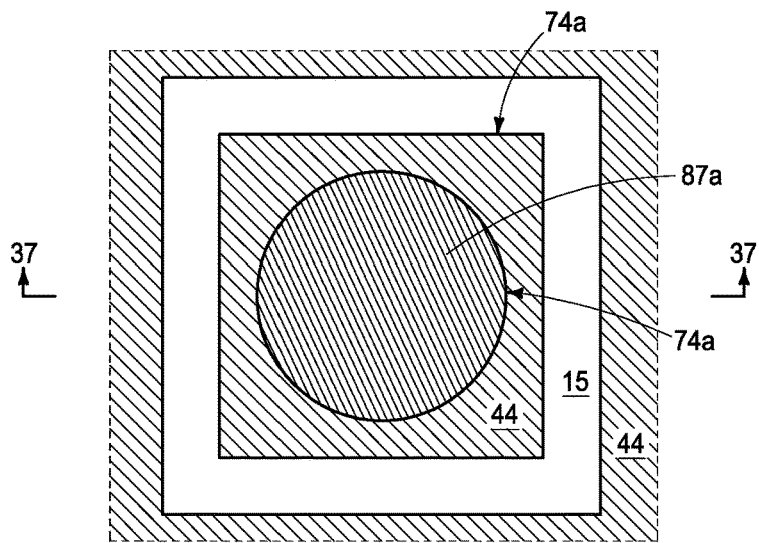

Referring to FIGS. 17-19, and in one embodiment, material 30 (e.g., silicon dioxide), material 32 (e.g., silicon nitride), and material 34 (e.g., silicon dioxide or a combination of silicon dioxide and silicon nitride) have been etched in tier 22z to expose a sidewall 41 of channel material 36 of channel-material strings 53 in lowest first tier 22z. Any of materials 30, 32, and 34 in tier 22z may be considered as being sacrificial material therein. As an example, consider an embodiment where lining 81 is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example depicted construction. In one embodiment and as shown, such etching has been conducted selectively relative to lining 81 (when present). In one embodiment, materials 62 and 63 (not shown in memory-block regions 58) are also removed. When so removed, such may be removed when removing materials 30, 32, and 34 are removed, for example if materials 62 and 63 comprise one or both of silicon dioxide and silicon nitride. Alternately, when so removed, such may be removed separately (e.g., by isotropic etching). The artisan is capable of selecting other chemistries for etching other different materials where a construction as shown is desired. All, some, or none of materials 62 and 63 may also be removed in TAV region 19.

After exposing sidewall 41, conductive material 42 (e.g., conductively-doped polysilicon) has been formed in lowest first tier 22z and in one embodiment directly against sidewall 41 of channel material 36. In one embodiment and as shown, such has been formed directly against a bottom of conducting material 47 of conducting-material tier 21 and directly against a top of conductor material 43 of conductor tier 16, thereby directly electrically coupling together channel material 36 of individual channel-material strings 53 with conductor material 43 of conductor tier 16 and conducting material 47 of conducting-material tier 21.

Referring to FIGS. 20 and 21, conductive material 42 has been removed from trenches 40 as has lining 81 (not there-shown). Lining 81 (when present and removed) may be removed before or after forming conductive material 42. In one embodiment as shown, conducting material 47 of tier 21 and conductive material 42 of tier 22z being directly against one another may collectively be considered as the lowest conductive tier at least in array region 12.

Referring to FIGS. 22-30, material 26 of conductive tiers 22 in array region 12 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 in conductive tiers 22 in array region 12 in the example embodiment is sacrificial and has been replaced with conducting material 48, and which has thereafter been removed from trenches 40, thus forming individual conductive lines 29 (e.g., word-lines) and elevationally-extending strings 49 of individual transistors and/or memory cells 56.

Some, all, or none of material 26 may be removed from TAV region 19 (removal of all being shown) and replaced with conducting material 48, for example depending on proximity of trenches 40 that are closest thereto and/or presence or lack thereof of etch-blocking material(s)/structure(s) in tiers 22 in upper portion 18U (not shown) and presence of other openings (e.g., trenches).

A thin insulative lining (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, and $Al_2O_3$.

Any other attribute(s) or aspect(s) as shown and/or described herein with respect to other embodiments may be used.

An alternate example construction 10a and method are next described with reference to FIGS. 31-39. Like numerals from the above-described embodiments have been used where appropriate, with some construction differences being indicated with the suffix "a" or with different numerals. FIGS. 31-35 correspond in processing sequence to that immediately after FIG. 3 and alternate to that of FIG. 7. In FIGS. 31-35, the silicon-containing material (e.g., Si of conductively-doped polysilicon 43 and Si of $WSi_x$ 44) has been reacted with a metal halide to deposit metal 87a in conductor tier 16. In one such embodiment where material 43 comprises conductively-doped polysilicon and metal 87a comprises elemental-form metal, and as shown, a metal silicide 88 is formed laterally-between conductively-doped polysilicon 43 and elemental-form metal 87a (e.g., $WSi_x$ if the elemental-form metal is W as a result of reaction of W with Si). FIGS. 36-39 show subsequent processing analogous to that through FIGS. 22-30 whereby TAVs 74a have been formed. Ideally, radially-outer conductive lining 83a, when present, is punch-etched as shown and whereby an elemental-form metal conductive core 73 is directly against an elemental-form metal 87a. Any other attribute(s) or aspect(s) as shown and/or described herein with respect to other embodiments may be used.

Figure 40:
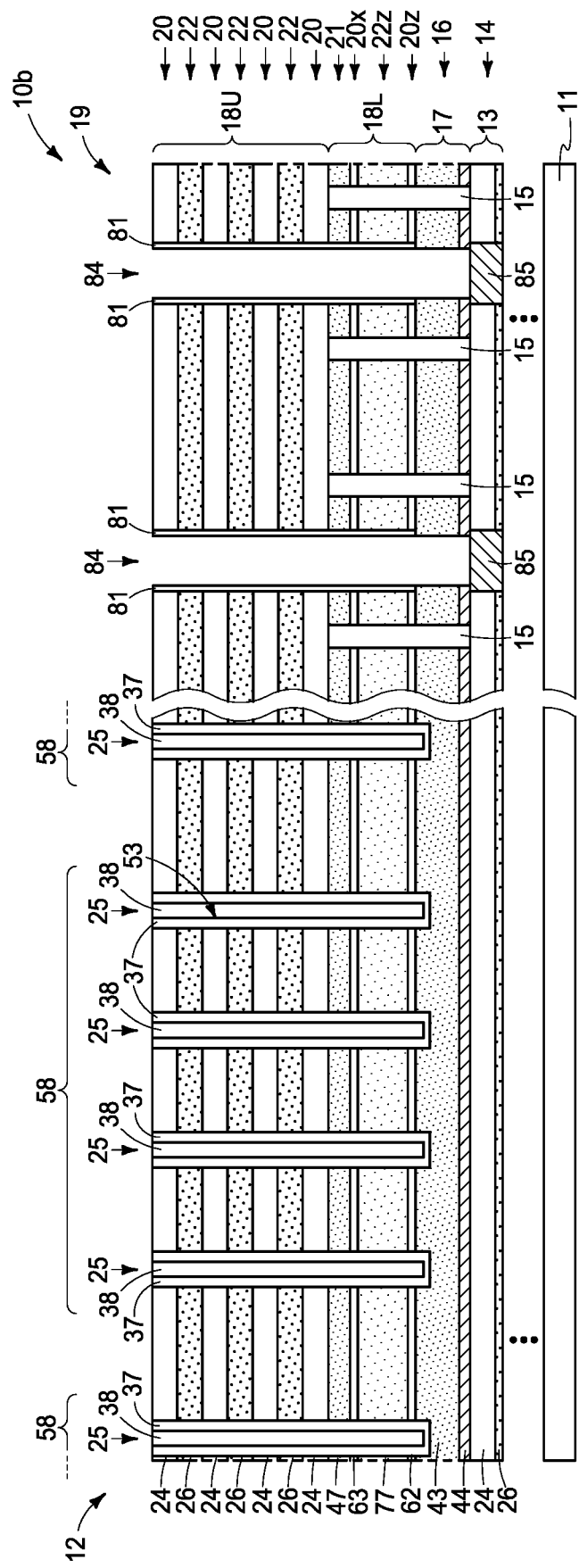
Figure 41:
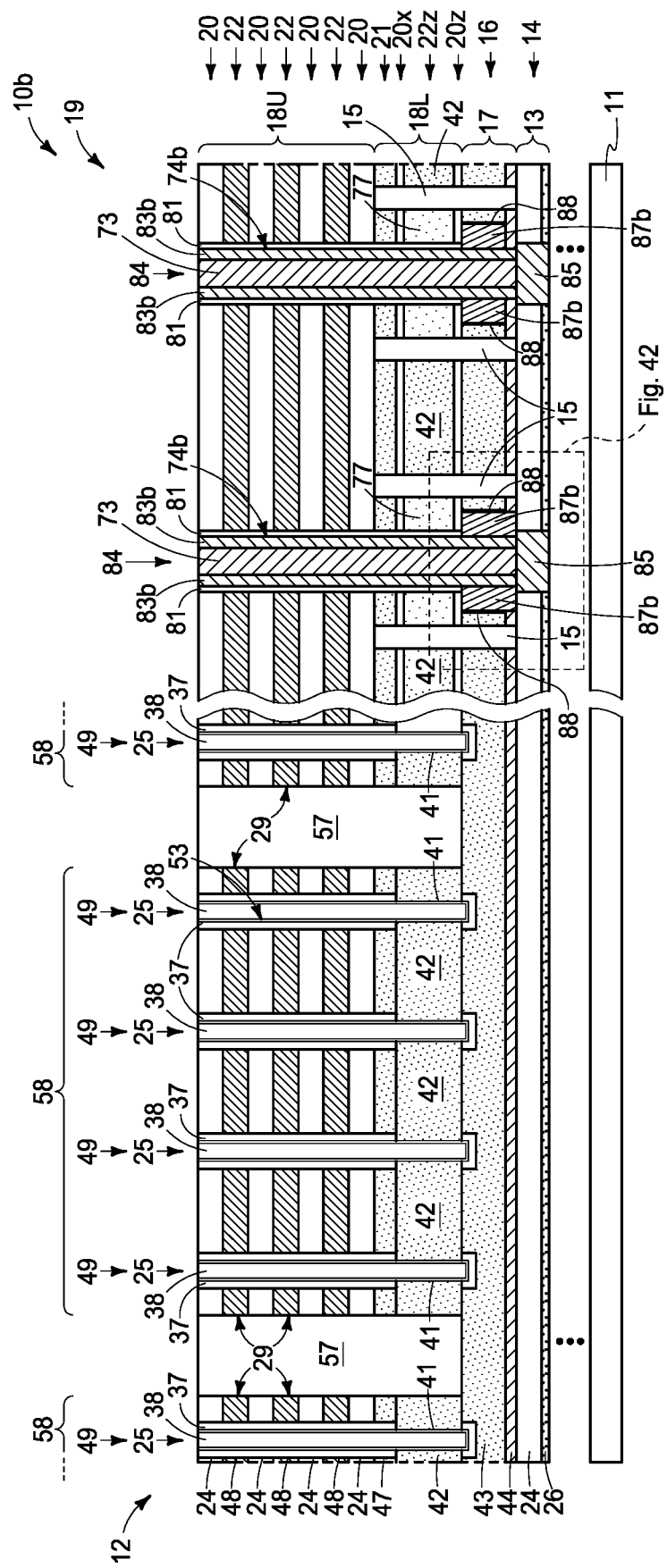
Figure 42:
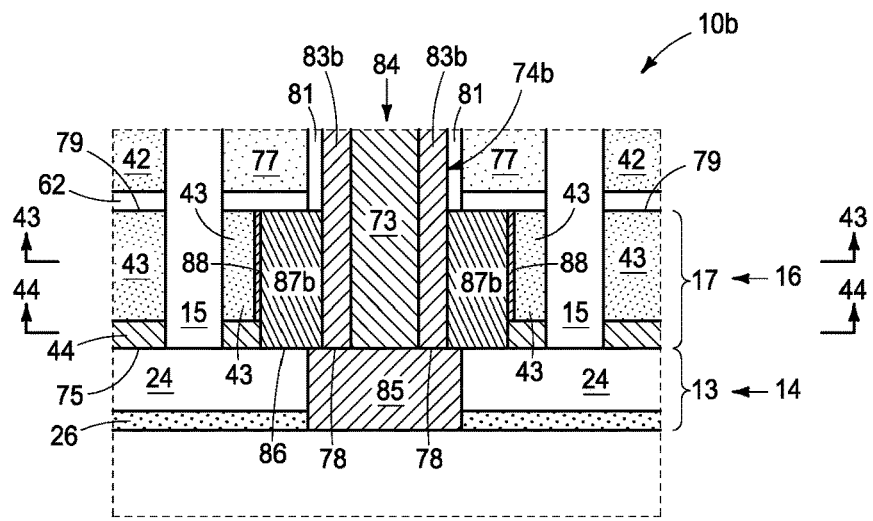
Figure 43:
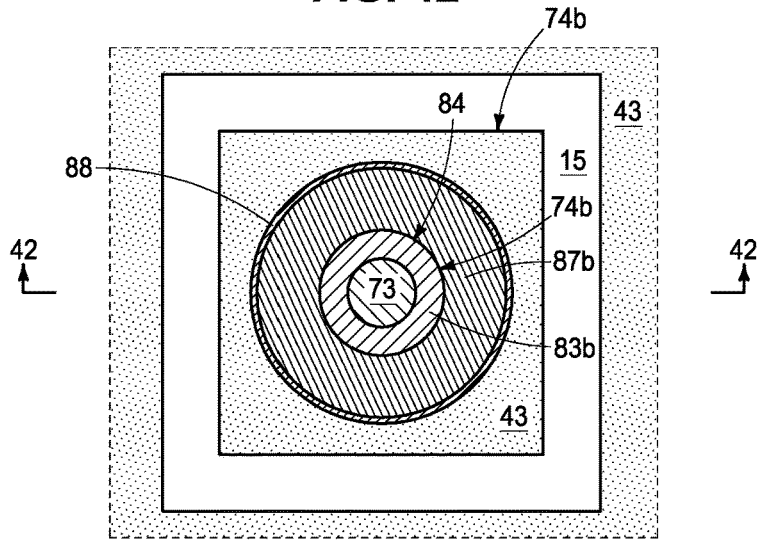
Figure 44:
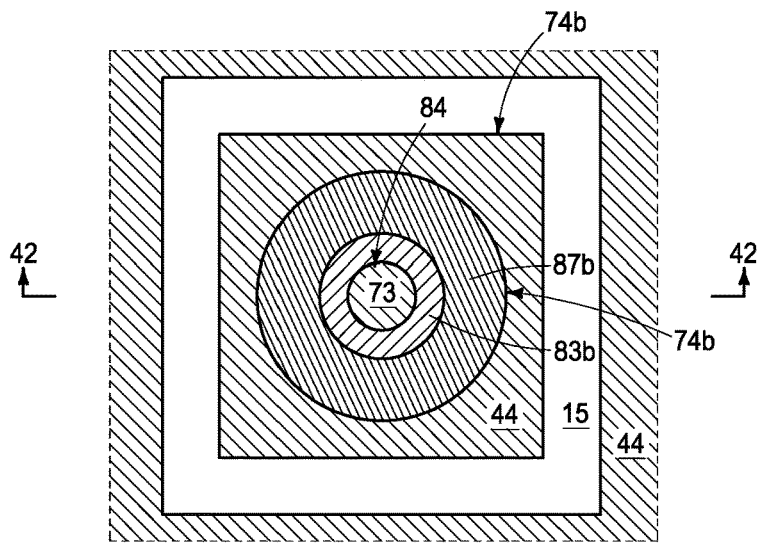
Figure 45:
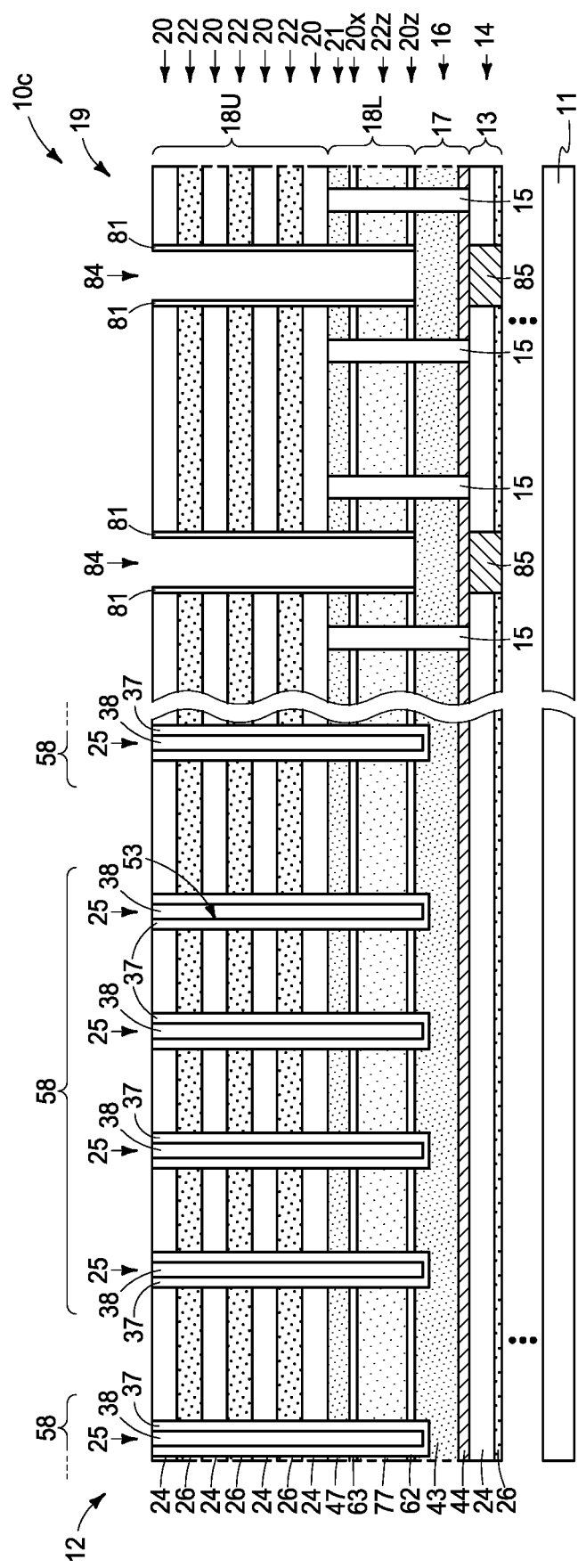

An alternate example construction 10b and method are next described with reference to FIGS. 40-44. Like numerals from the above-described embodiments have been used where appropriate, with some construction differences being indicated with the suffix "b" or with different numerals. FIG. 40 corresponds in processing sequence to that of FIG. 3 but wherein TAV openings 84 have been etched through conductor material 44. FIGS. 41-44 show subsequent processing analogous to that through FIGS. 36-39. Reaction-product metal 87b has been formed, followed by optional forming of radially-outer conductive lining 83b, and followed by forming of conductive core 73 to form TAVs 74b. Ideally, radially-outer conductive lining 83b, when present, is punch-etched as shown and whereby an elemental-form metal conductive core 73 is directly against an elemental-form metal of lower vias 85 (e.g., when such comprise such). Any other attribute(s) or aspect(s) as shown and/or described herein with respect to other embodiments may be used.

An alternate example construction 10c and method are next described with reference to FIGS. 45-50. Like numerals from the above-described embodiments have been used where appropriate, with some construction differences being indicated with the suffix "c" or with different numerals. FIG.

Figure 46:
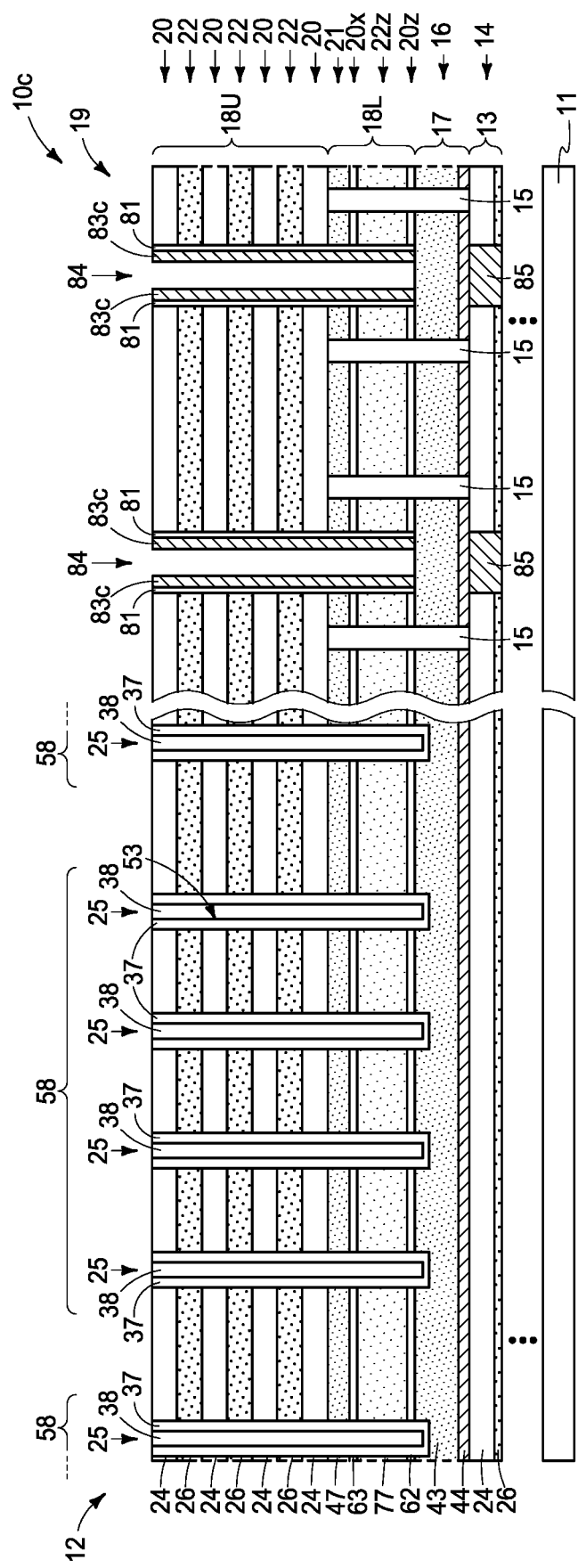
Figure 47:
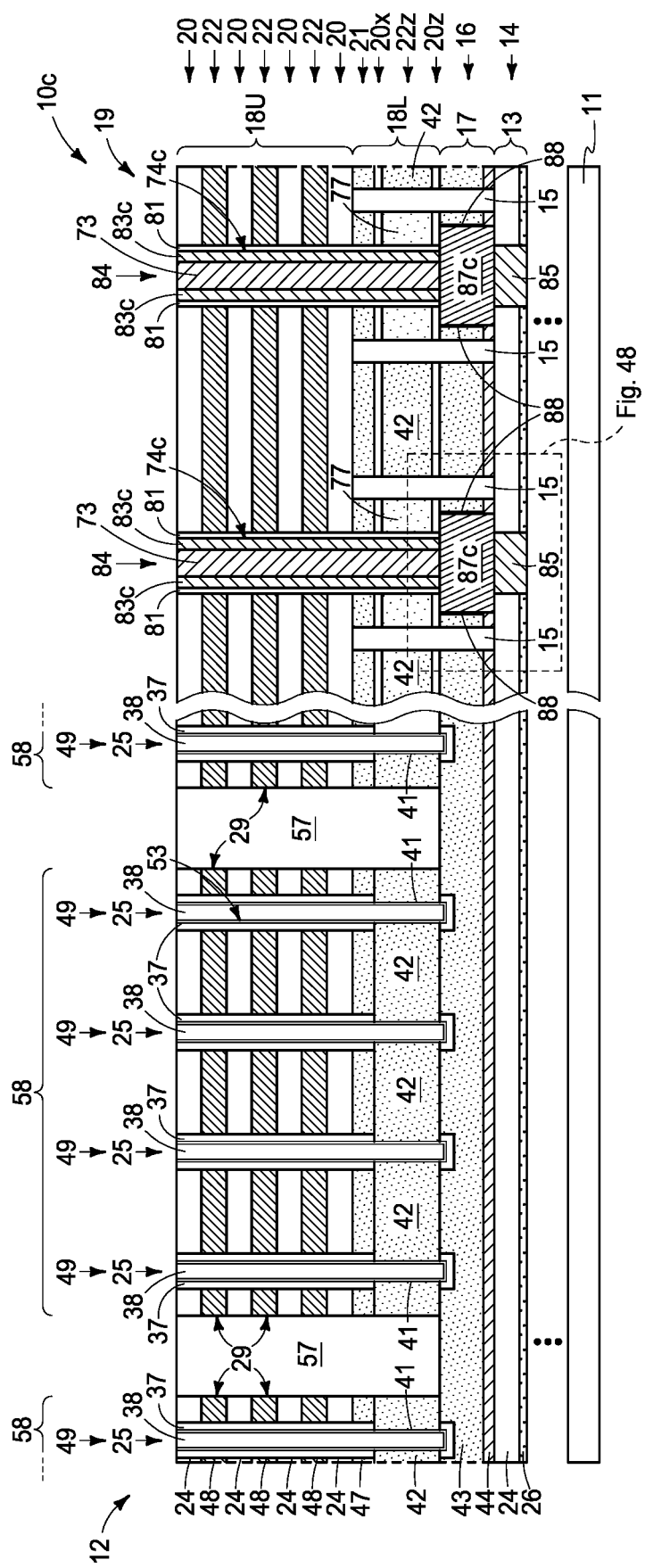
Figure 48:
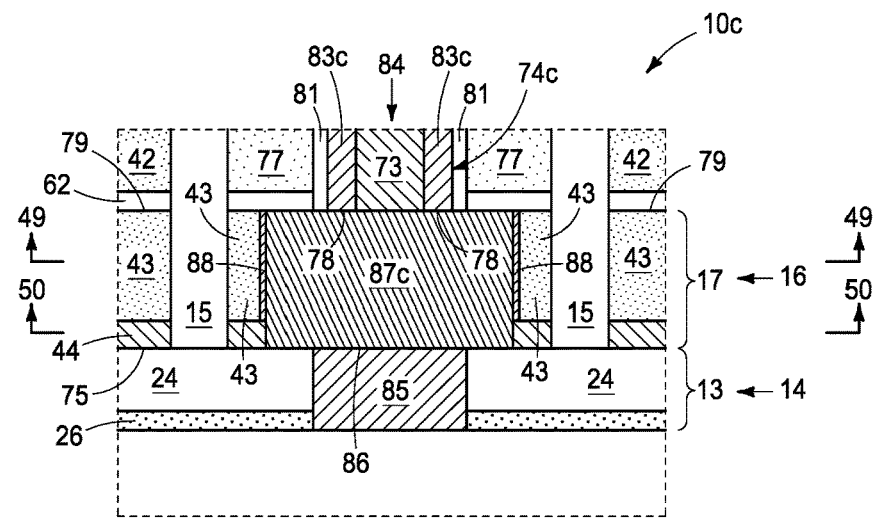
Figure 49:
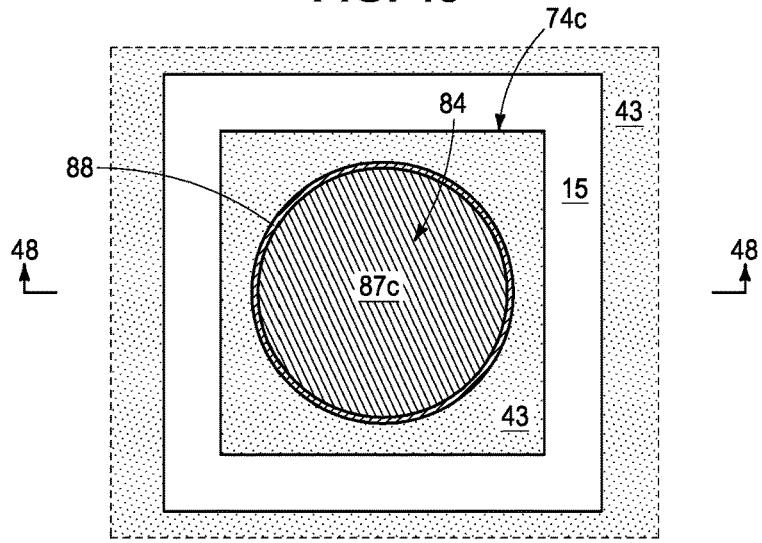
Figure 50:
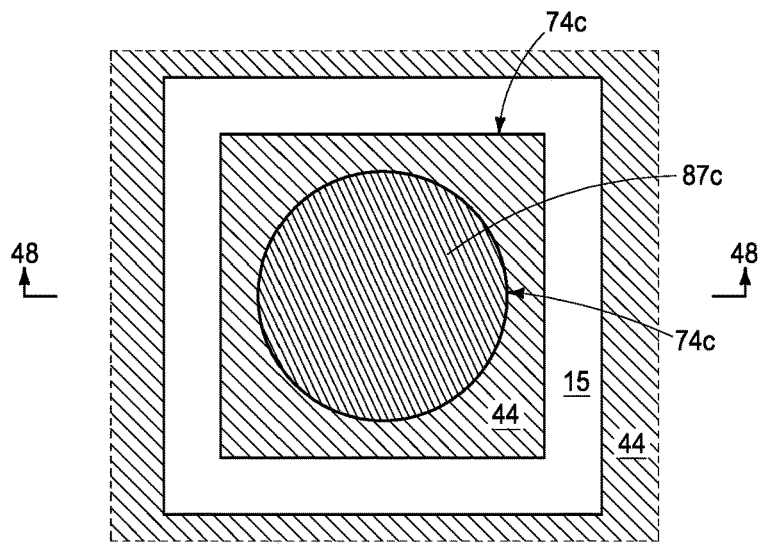

45 corresponds in processing sequence to that of FIG. 3 but wherein TAV openings 84 have been etched to stop atop conductor material 43. FIG. 46 shows subsequent processing analogous to that through FIG. 7 whereby radially-outer conductive lining 83c has optionally been formed and punch-etched. FIGS. 47-50 show subsequent processing analogous to that through FIGS. 41-44 whereby metal 87c and TAVs 74c have been formed. Any other attribute(s) or aspect(s) as shown and/or described herein with respect to other embodiments may be used.

Figure 51:
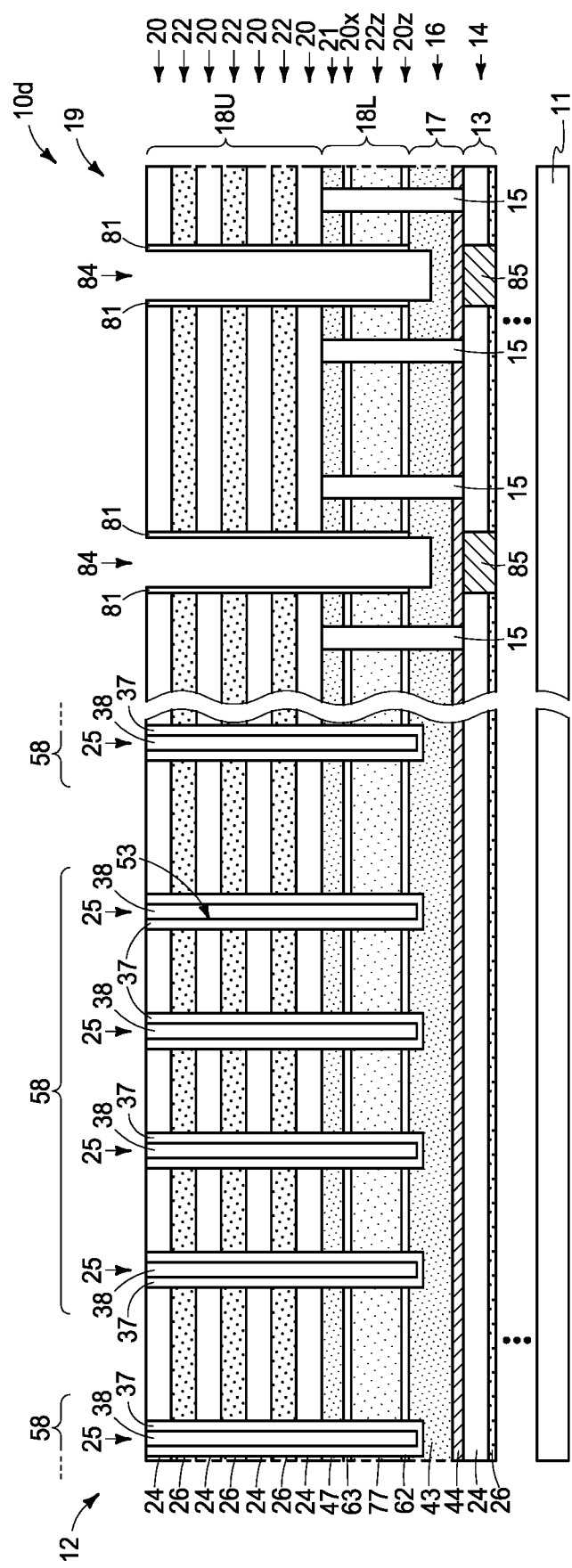
Figure 52:
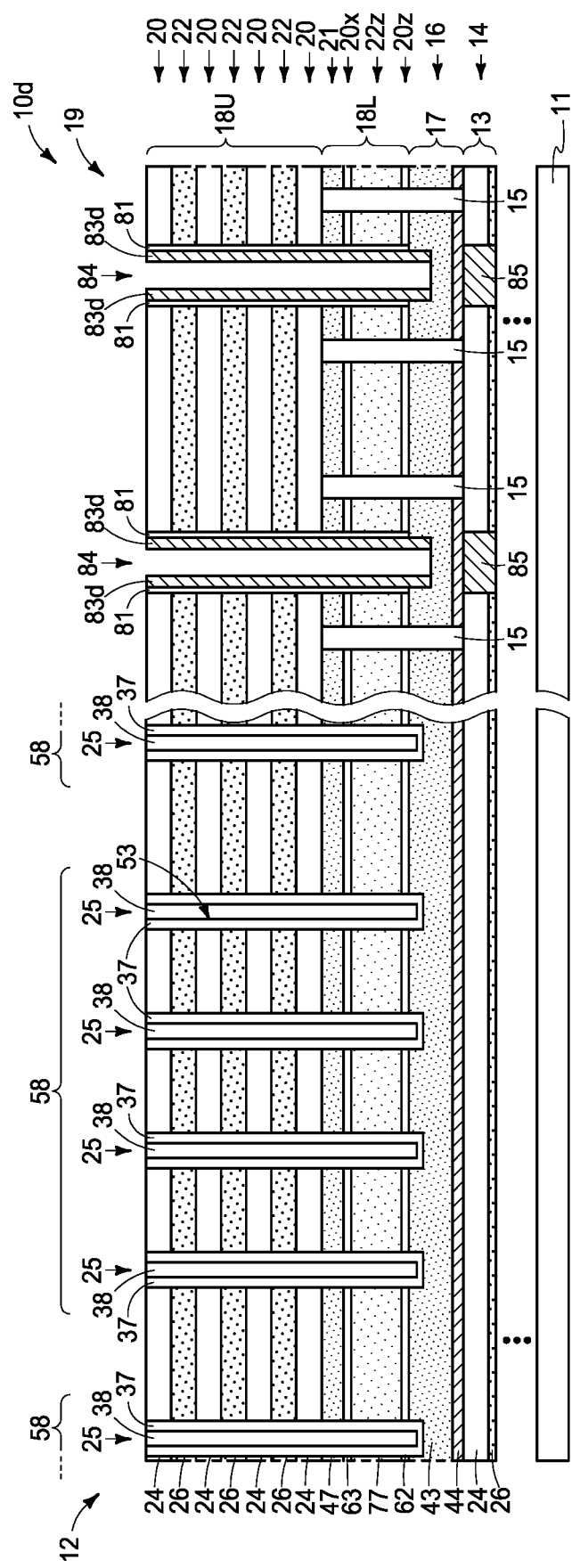
Figure 53:
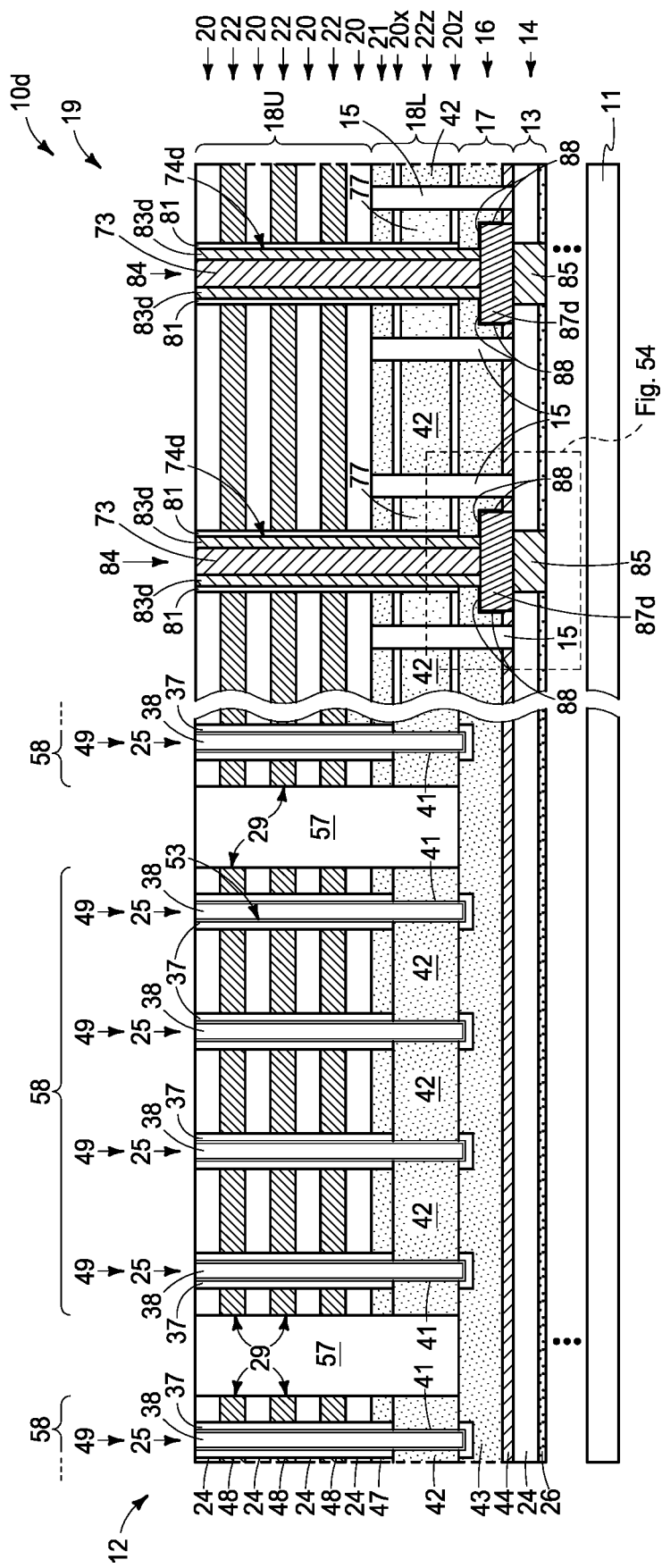
Figures 54, 55, 56:
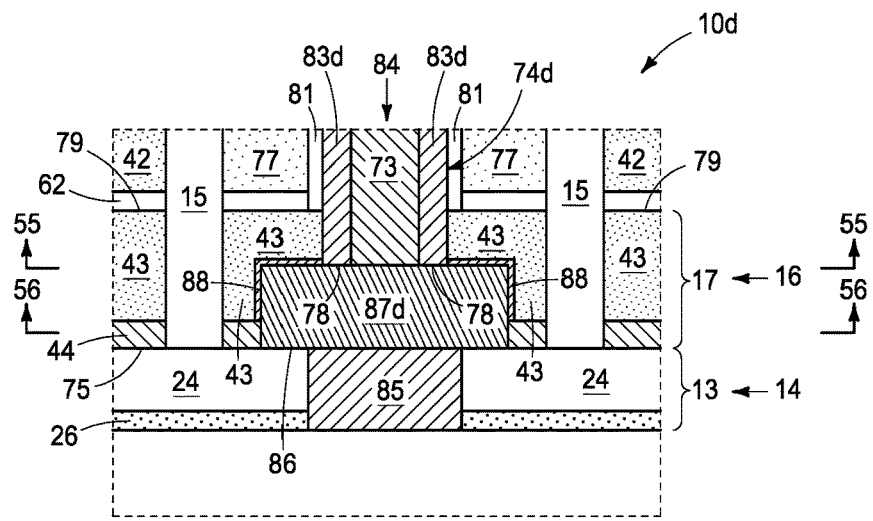

An alternate example construction 10d and method are next described with reference to FIGS. 51-56. Like numerals from the above-described embodiments have been used where appropriate, with some construction differences being indicated with the suffix "d" or with different numerals. FIG. 51 corresponds in processing sequence to that of FIG. 3 but wherein TAV openings 84 have been etched into and to stop within conductor material 43. FIG. 52 shows subsequent processing analogous to that through FIG. 46. Radially-outer conductive lining 83d has optionally been formed and punch-etched as shown. FIGS. 53-56 show subsequent processing analogous to that through FIGS. 47-50 whereby TAVs 74d have been formed and that comprise reaction-product metal 87d. Any other attribute(s) or aspect(s) as shown and/or described herein with respect to other embodiments may be used.

Figure 57:
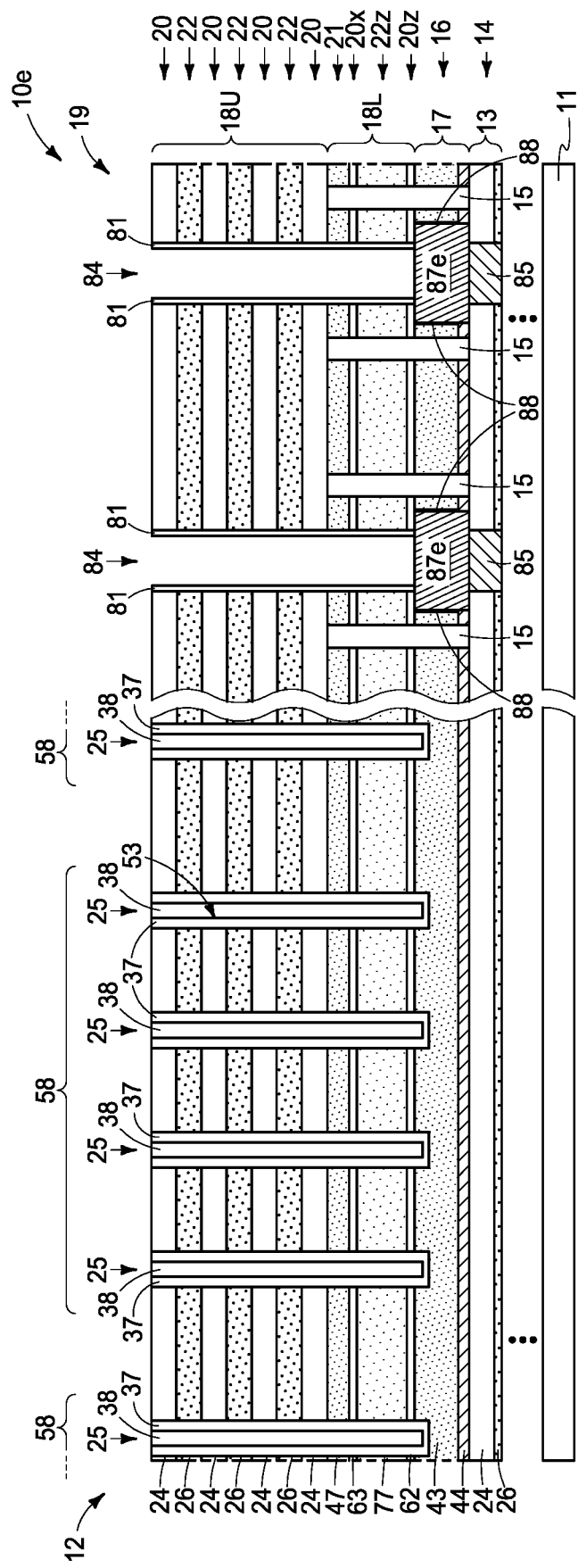
Figure 58:
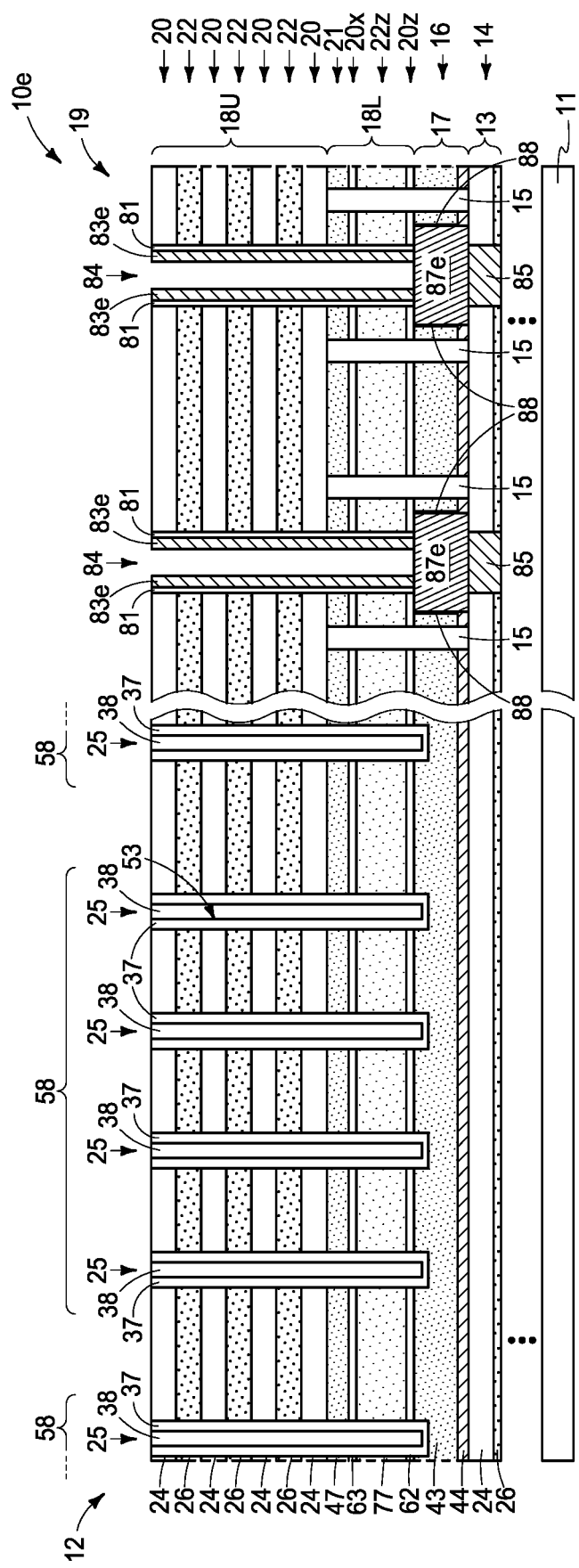
Figure 59:
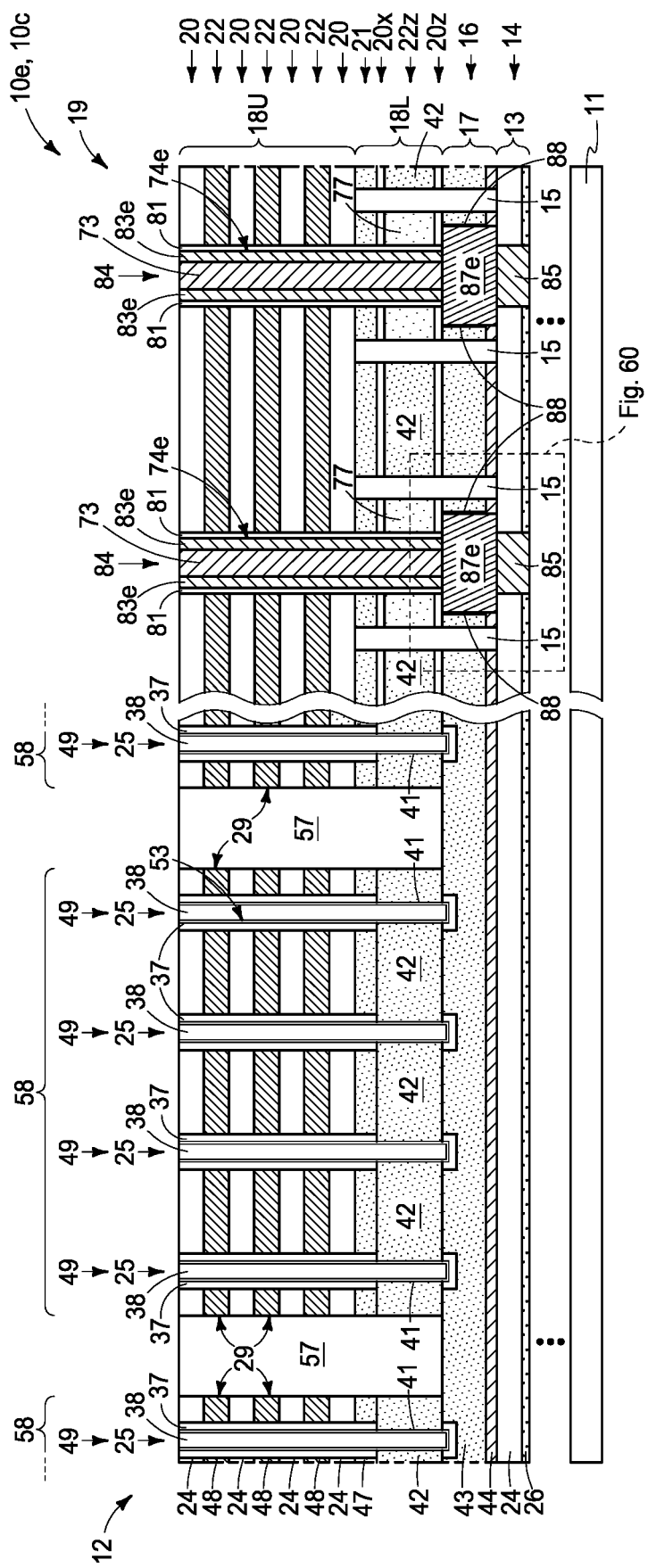
Figure 60:
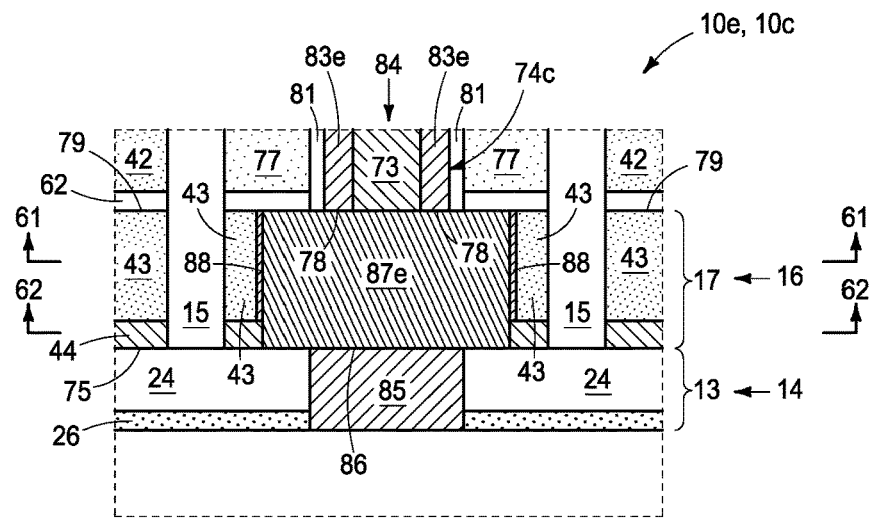
Figure 61:
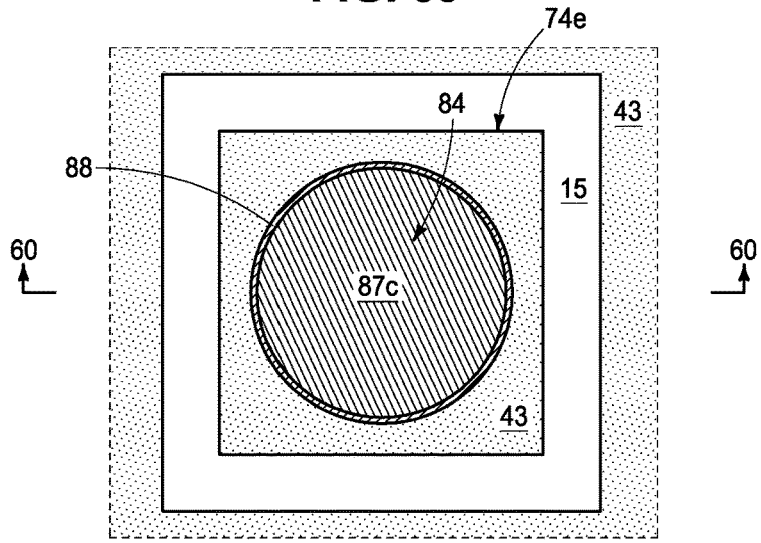
Figure 62:
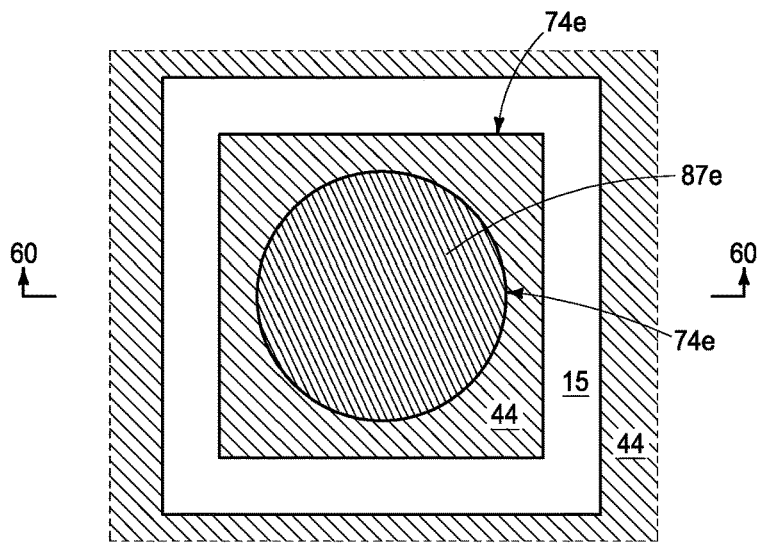

An alternate example construction 10e and method are next described with reference to FIGS. 57-62. Like numerals from the above-described embodiments have been used where appropriate, with some construction differences being indicated with the suffix "e" or with different numerals. FIG. 57 corresponds in processing sequence to that immediately after FIG. 45 and alternate to that of FIG. 46. The silicon-containing material (e.g., Si of conductively-doped polysilicon 43 and Si of $WSi_x$ 44) has been reacted with a metal halide to deposit metal 87e in conductor tier 16. FIG. 58 shows subsequent processing analogous to that through FIG. 7 whereby radially-outer conductive lining 83e has optionally been formed and optionally punch-etched. FIGS. 59-62 show subsequent processing analogous to that through FIGS. 53-56 whereby metal 87e and TAVs 74e have been formed. Any other attribute(s) or aspect(s) as shown and/or described herein with respect to other embodiments may be used.

Figure 63:
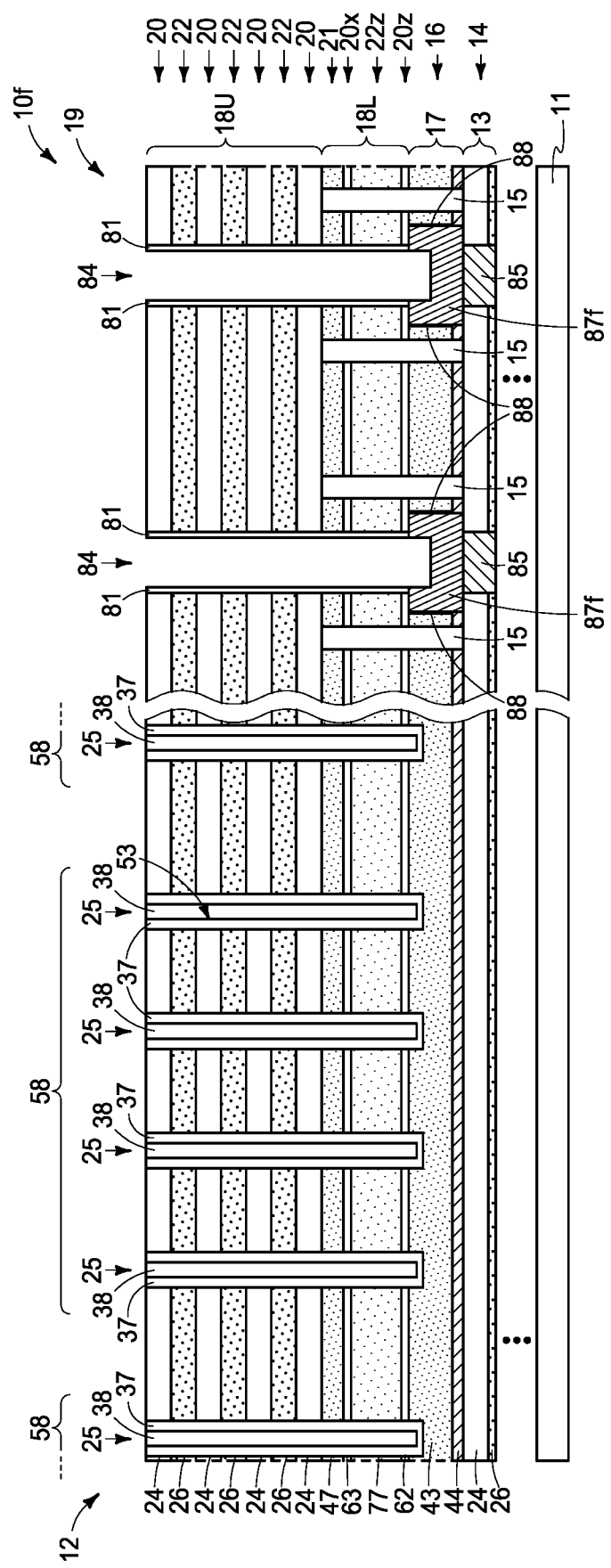
Figure 64:
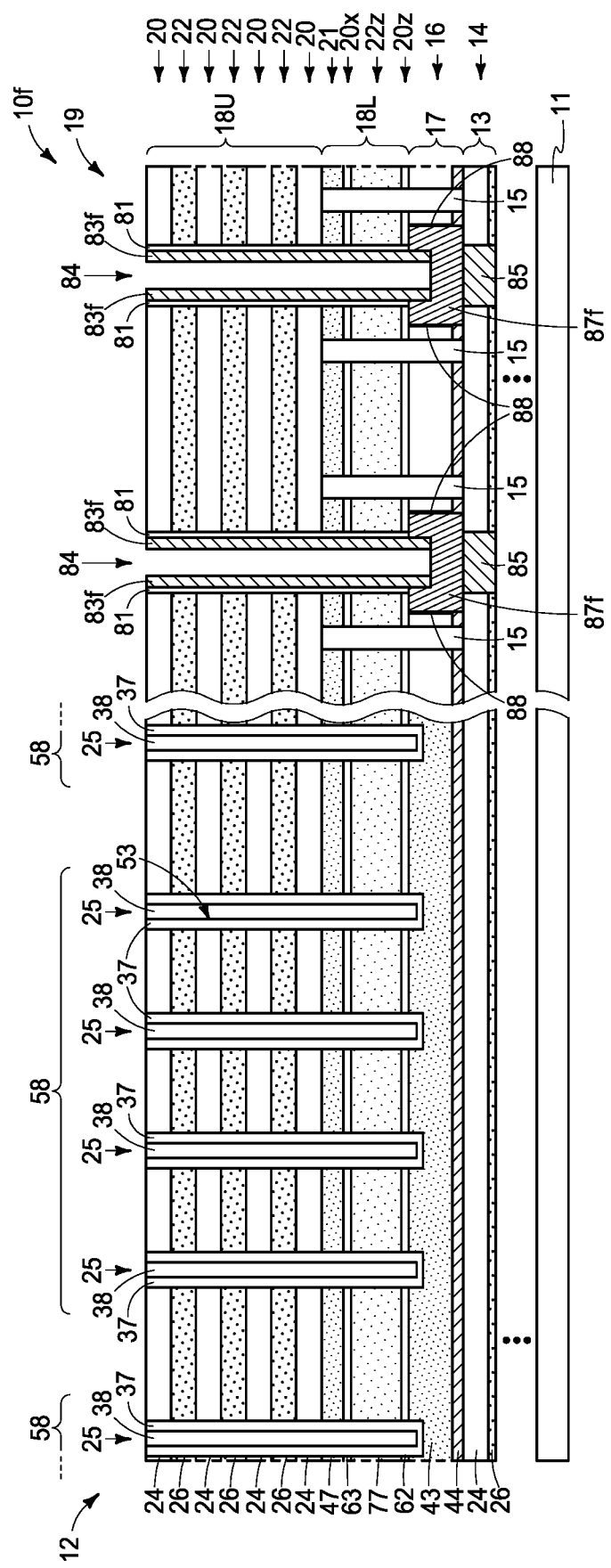
Figure 65:
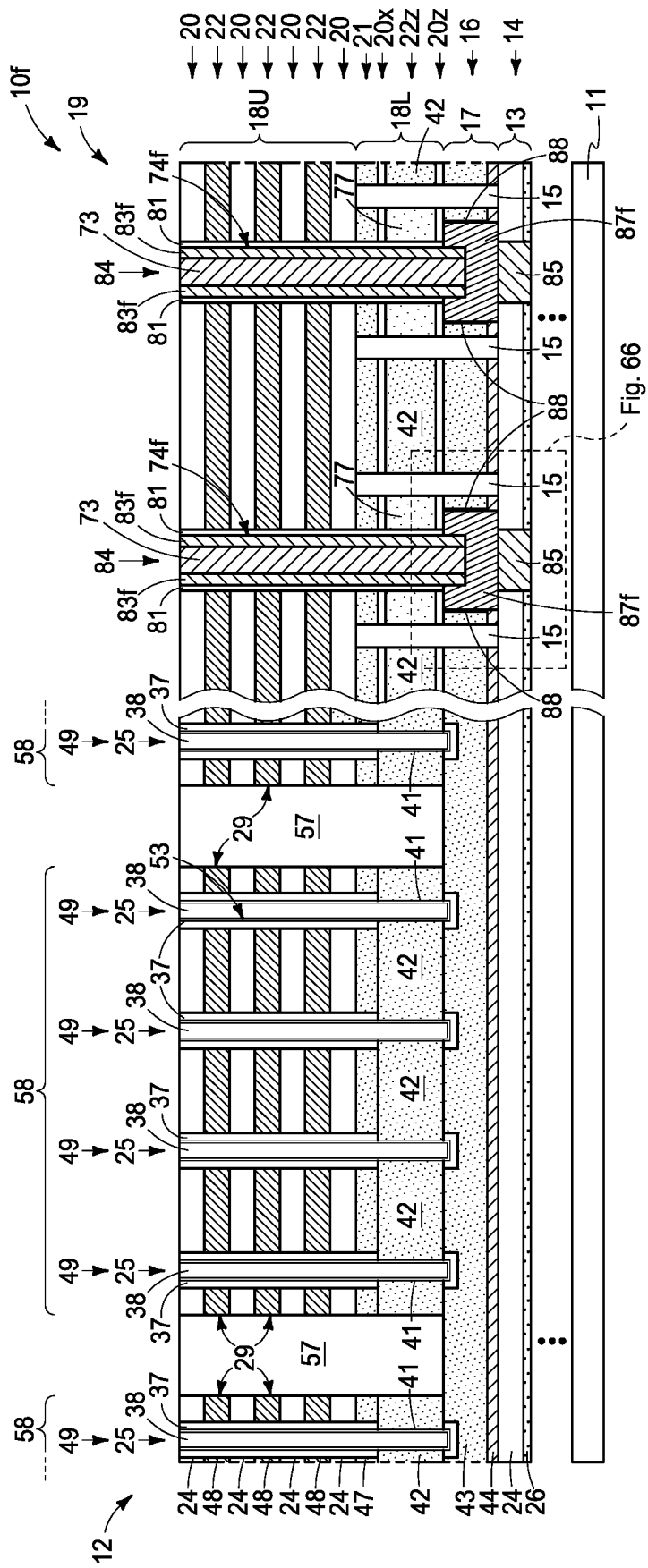
Figure 66:
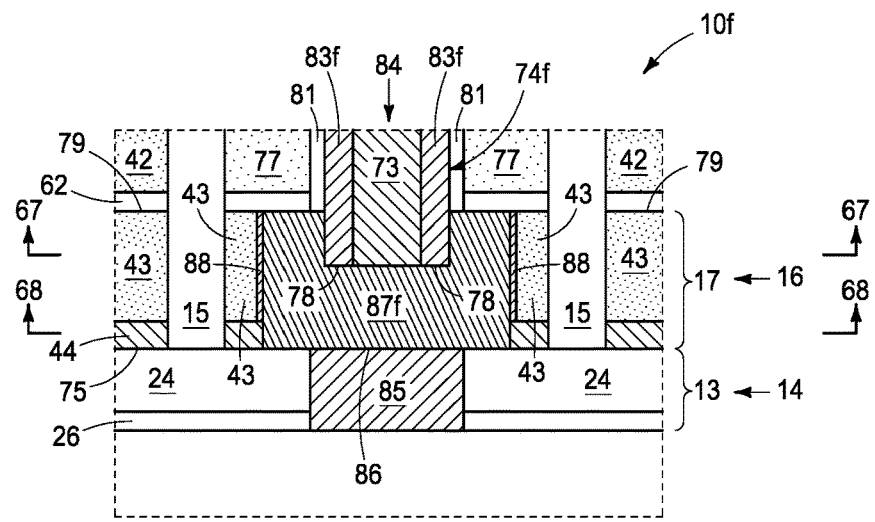
Figure 67:
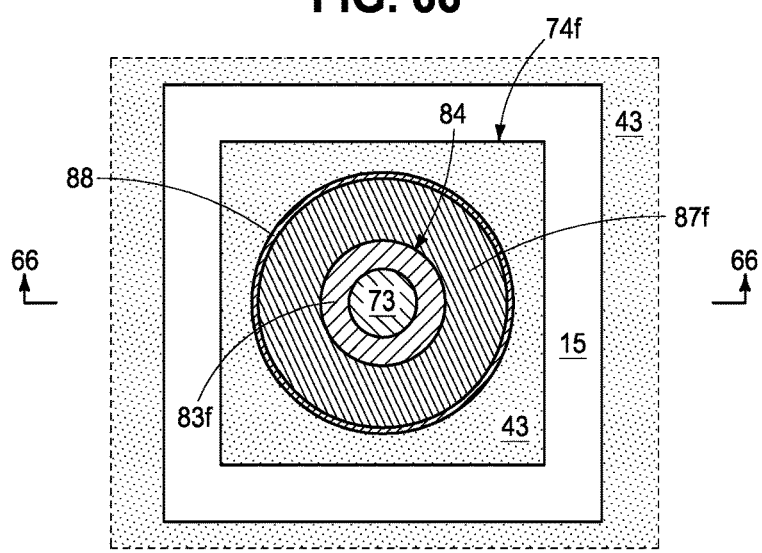

An alternate example construction 10f and method are next described with reference to FIGS. 63-68. Like numerals from the above-described embodiments have been used where appropriate, with some construction differences being indicated with the suffix "f" or with different numerals. FIG. 63 corresponds in processing sequence to that of FIG. 3 but wherein TAV openings 84 have been etched into and to stop within conductor material 43, including subsequent processing whereby the silicon-containing material (e.g., Si of conductively-doped polysilicon 43 and Si of $WSi_x$ 44) has been reacted with a metal halide to deposit metal 87f in conductor tier 16. In FIG. 64, radially-outer conductive lining 83f has optionally been formed and optionally punch-etched as shown. FIGS. 65-68 show subsequent processing analogous to that through FIGS. 59-62 whereby TAVs 74f have been formed. Any other attribute(s) or aspect(s) as shown and/or described herein with respect to other embodiments may be used.

The above shown example embodiments have an example silicon-containing material 43 and an example silicon-containing material 44 each of which is reacted to form metal 87*. Alternately when both are present only one of such may so react.

Method embodiments of the invention may result in conductive vias 74* having greater quantity of typically higher conductive materials (e.g., elemental-form metal material of conductive core 73) than typically lower conductive material (e.g., metal nitride of linings 83).

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*) directly above a conductor tier (e.g., 16). Strings (e.g., 49) of memory cells (e.g., 56) comprising channel-material strings (e.g., 53) extend through the insulative tiers and the conductive tiers. The channel-material strings directly electrically couple with conductor material (e.g., 17) of the conductor tier. A through-array-via (TAV) region (e.g., 19) comprises individual TAVs that extend through the stack and into the conductor tier. The individual TAVs have a lowest surface (e.g., 86) in the conductor tier that comprises elemental-form metal (e.g., 87*).

In one embodiment, the lowest surface 86 in the conductor tier is a lowest surface of the conductor tier (e.g., 75). In one such embodiment, the lowest surface of the conductor tier and of the individual vias in the conductor tier comprises a metal silicide (e.g., 44). In one such embodiment, the elemental-form metal and the metal silicide are directly against one another and in one such latter embodiment wherein the metal silicide circumferentially encircles the elemental-form metal. Regardless, in one embodiment, the elemental-form metal comprises elemental tungsten of beta phase and the individual TAVs comprise elemental tungsten of alpha phase directly there-above, and in one such embodiment the elemental tungsten of beta phase and the elemental tungsten of alpha phase are directly against one another. Regardless, in one embodiment, the individual TAVs comprise conductively-doped polysilicon (e.g., 43) directly above the lowest surface of the conductor tier and that is aside the elemental-form metal of the individual TAVs and, in one such embodiment, metal silicide (e.g., 88) is laterally-between the conductively-doped polysilicon and the elemental-form metal.

Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*) directly above a conductor tier (e.g., 16). Strings (e.g., 49) of memory cells (e.g., 56) comprising channel-material strings (e.g., 53) extend through the insulative tiers and the conductive tiers. The channel-material strings directly electrically couple with conductor material (e.g., 17) of the conductor tier. A through-array-via (TAV) region (e.g., 19) comprises individual TAVs that extend through the stack and into the conductor tier. The individual TAVs comprise a radially-outer conductive lining comprising a metal nitride.

The individual TAVs comprising a conductive core (e.g., 73) radially-inward of and of higher conductivity than the radially-outer conductive lining. The radially-outer conductive lining has a lowest surface (e.g., 78) that is in and below a top surface (e.g., 79) of the conductor tier.

In one embodiment, the individual TAVs comprise conductively-doped polysilicon (e.g., 43) in the conductor tier that circumferentially encircles the radially-outer conductive lining that is in the conductor tier. In one such embodiment, the conductively-doped polysilicon is directly against the metal nitride of the radially-outer conductive lining and in another embodiment the conductively-doped polysilicon is not directly against the metal nitride of the radially-outer conductive lining (e.g., a metal silicide 88 being therebetween).

In one embodiment, the individual TAVs comprise elemental-form metal in the conductor tier that circumferentially encircles the radially-outer conductive lining that is in the conductor tier. In one such embodiment, the individual TAVs comprise conductively-doped polysilicon in the conductor tier that circumferentially encircles the elemental-form metal that circumferentially encircles the radially-outer conductive lining that is in the conductor tier, in one such embodiment wherein the individual TAVs comprise circumferentially-encircling metal silicide radially-between the conductively-doped polysilicon and the elemental-form metal.

Any other attribute(s) or aspect(s) as shown and/or described herein with respect to other embodiments may be used.

In one embodiment, a memory array (e.g., comprising strings (e.g., 49) of memory cells (e.g., 56) comprises laterally-spaced memory blocks (e.g., 58) individually comprising a vertical stack (e.g., 18\*) comprising alternating insulative tiers (e.g., 20\*) and conductive tiers (e.g., 22\*) directly above a conductor tier (e.g., 16). Strings (e.g., 49) of memory cells (e.g., 56) comprising channel-material strings (e.g., 53) extend through the insulative tiers and the conductive tiers. The channel-material strings directly electrically couple with conductor material (e.g., 17) of the conductor tier. A through-array-via (TAV) region (e.g., 19) comprises individual TAVs that extend through the stack and into the conductor tier. The individual TAVs comprise a radially-outer conductive lining comprising a metal nitride. The individual TAVs comprise a conductive core (e.g., 73) radially-inward of and of higher conductivity than the radially-outer conductive lining. The radially-outer conductive lining has a lowest surface (e.g., 78) that is directly against a top surface (e.g., 79) of the conductor tier.

Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating first tiers and second tiers directly above a conductor tier that comprises silicon-containing material. The stack comprises laterally-spaced memory-block regions and a through-array-via (TAV) region. The stack comprises channel-material strings that extend through the first tiers and the second tiers in the memory-block regions. The stack comprises TAV openings in the TAV region that extend to the silicon-containing material of the conductor tier. A metal halide is reacted with the silicon of the silicon-containing material to deposit the metal of the metal halide in the conductor tier. After depositing the metal, conductive material is formed in the TAV openings directly against the deposited metal and therefrom a TAV is formed in individual of the TAV openings that comprises the conductive material and the deposited metal.

In some embodiments, a memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple with conductor material of the conductor tier. A through-array-via (TAV) region comprises individual TAVs that extend through the stack and into the conductor tier. The individual TAVs have a lowest surface in the conductor tier that comprises elemental-form metal.

In some embodiments, a memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple with conductor material of the conductor tier. A through-array-via (TAV) region comprises individual TAVs that extend through the stack and into the conductor tier. The individual TAVs comprise a radially-outer conductive lining comprising a metal nitride. The individual TAVs comprise a conductive core radially-inward of and of higher conductivity than the radially-outer conductive lining. The radially-outer conductive lining has a lowest surface that is in and below a top surface of the conductor tier.

In some embodiments, a memory array comprising strings of memory cells comprises laterally-spaced memory blocks individually comprising a vertical stack comprising alternating insulative tiers and conductive tiers directly above a conductor tier. Strings of memory cells comprise channel-material strings that extend through the insulative tiers and the conductive tiers. The channel-material strings directly electrically couple with conductor material of the conductor tier. A through-array-via (TAV) region comprises individual TAVs that extend through the stack and into the conductor tier. The individual TAVs comprise a radially-outer conductive lining comprising a metal nitride. The individual TAVs comprise a conductive core radially-inward of and of higher conductivity than the radially-outer conductive lining. The radially-outer conductive lining has a lowest surface that is directly against a top surface of the conductor tier.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming a stack comprising vertically-alternating first tiers and second tiers directly above a conductor tier that comprises silicon-containing material, the stack comprising laterally-spaced memory-block regions and a through-array-via (TAV) region, the stack comprising channel-material strings extending through the first tiers and the second tiers in the memory-block regions, the stack comprising TAV openings in the TAV region that extend to the silicon-containing material of the conductor tier;
    reacting a metal halide with the silicon of the silicon-containing material to deposit the metal of the metal halide in the conductor tier; and
    after depositing the metal, forming conductive material in the TAV openings directly against the deposited metal and forming therefrom a TAV in individual of the TAV openings that comprises the conductive material and the deposited metal.

2. The method of claim 1 wherein the deposited metal is at least primarily in elemental form.

3. The method of claim 1 wherein the deposited metal comprises at least one of a metal compound and an alloy of two or more elemental metals.

4. The method of claim 1 wherein the deposited metal is at least primarily in elemental form and also comprises at least one of a metal compound and an alloy of two or more elemental metals.

5. The method of claim 1 wherein the conductive material comprises elemental tungsten of alpha phase and the deposited metal is at least primarily elemental tungsten of beta phase.

6. The method of claim 1 wherein the individual TAVs have a lowest surface in the conductor tier that comprises elemental-form metal that is the metal from the metal halide.

7. The method of claim 1 wherein the conductive material of the individual TAVs comprises a radially-outer conductive lining comprising a metal nitride and a conductive core radially-inward of and of higher conductivity than the radially-outer conductive lining, the radially-outer conductive lining having a lowest surface that is in and below a top surface of the conductor tier.

8. The method of claim 1 wherein the conductive material of the individual TAVs comprises a radially-outer conductive lining comprising a metal nitride and a conductive core radially-inward of and of higher conductivity than the radially-outer conductive lining, the radially-outer conductive lining having a lowest surface that is directly against a top surface of the conductor tier.

* * * * *